(12) United States Patent
Yeh et al.

(10) Patent No.: US 11,626,719 B2
(45) Date of Patent: Apr. 11, 2023

(54) ELECTROSTATIC DISCHARGE (ESD) PROTECTION CIRCUIT AND METHOD OF OPERATING THE SAME

(71) Applicant: TAIWAN SEMICONDUCTOR MANUFACTURING COMPANY, LTD., Hsinchu (TW)

(72) Inventors: Yu-Hung Yeh, Hsinchu (TW); Wun-Jie Lin, Hsinchu (TW); Jam-Wem Lee, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 158 days.

(21) Appl. No.: 17/147,253

(22) Filed: Jan. 12, 2021

(65) Prior Publication Data

US 2021/0305802 A1 Sep. 30, 2021

Related U.S. Application Data

(60) Provisional application No. 63/002,562, filed on Mar. 31, 2020.

(51) Int. Cl.
*H02H 3/08* (2006.01)
*H02H 1/00* (2006.01)

(52) U.S. Cl.
CPC ............ *H02H 3/08* (2013.01); *H02H 1/0007* (2013.01)

(58) Field of Classification Search
CPC ................. H01L 29/786; H01L 29/861; H01L 2224/0401; H01L 23/60; H01L 25/043;

(Continued)

(56) References Cited

U.S. PATENT DOCUMENTS 11,228,174 B1 * 1/2022 Fairbanks ............. H01L 27/027
2009/0323234 A1 * 12/2009 Bach .................... H01L 27/0251
361/56

(Continued)

FOREIGN PATENT DOCUMENTS

KR 100631958 10/2006
KR 20100104332 9/2010

(Continued)

OTHER PUBLICATIONS

Office Action dated Jan. 28, 2022 for corresponding case No. KR 10-2021-0032700. (pp. 1-4).

(Continued)

*Primary Examiner* — Jared Fureman
*Assistant Examiner* — Nicolas Bellido
(74) *Attorney, Agent, or Firm* — Hauptman Ham, LLP

(57) ABSTRACT

An electrostatic discharge (ESD) protection circuit includes a first diode, a second diode and an ESD clamp circuit. The first diode is in a semiconductor wafer, and is coupled to an input output (IO) pad. The second diode is in the semiconductor wafer, and is coupled to the first diode and the TO pad. The ESD clamp circuit is in the semiconductor wafer, and is coupled to the first diode and the second diode. The ESD clamp circuit includes a first signal tap region in the semiconductor wafer. The first signal tap region is coupled to a first voltage supply. The first diode is coupled to and configured to share the first signal tap region with the ESD clamp circuit.

20 Claims, 9 Drawing Sheets

Figure 1:
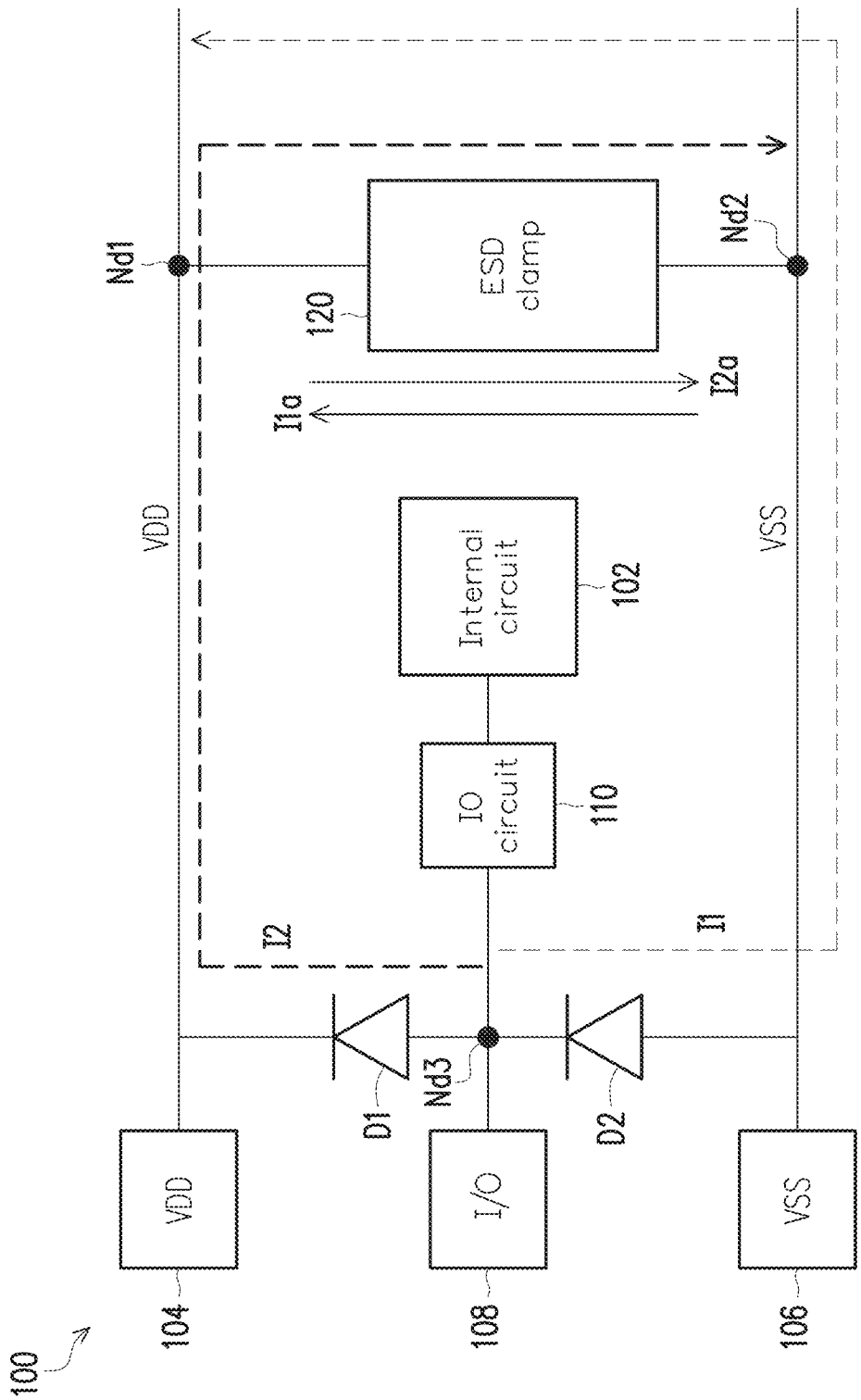

(58) Field of Classification Search
CPC . H01L 27/02; H01L 27/0248; H01L 27/0255; H01L 27/0285; H01L 27/0292; H01L 27/06; H01L 29/78696; H02H 1/0007; H02H 1/04; H02H 3/08; H02H 3/22; H02H 9/046; H05K 1/0259
See application file for complete search history.

(56) References Cited

U.S. PATENT DOCUMENTS

| | | | |
|---|---|---|---|
| 2013/0026550 A1 | 1/2013 | Yoshioka | |
| 2015/0228770 A1* | 8/2015 | Lin | H01L 29/0692 257/173 |
| 2017/0194786 A1* | 7/2017 | Tzeng | H02H 9/041 |
| 2018/0219007 A1* | 8/2018 | Shrivastava | H01L 29/742 |
| 2018/0277633 A1* | 9/2018 | Yoshioka | H01L 29/0619 |
| 2019/0229112 A1* | 7/2019 | Kutsukake | H01L 27/0266 |

FOREIGN PATENT DOCUMENTS

| | | |
|---|---|---|
| KR | 20130012565 | 2/2013 |
| TW | 201939709 | 10/2019 |
| TW | 201944571 | 11/2019 |
| TW | 201944677 | 11/2019 |

OTHER PUBLICATIONS

Office Action dated Aug. 3, 2021 for corresponding case No. TW 11020709040. (pp. 1-7).

Notice of Allowance dated Jul. 28, 2022 for corresponding case No. KR 10-2021-0032700. (pp. 1-6) English translation attached on p. 1.

* cited by examiner

ELECTROSTATIC DISCHARGE (ESD) PROTECTION CIRCUIT AND METHOD OF OPERATING THE SAME

PRIORITY CLAIM AND CROSS-REFERENCE

This application claims the benefit of U.S. Provisional Application No. 63/002,562, filed Mar. 31, 2020, which is incorporated herein by reference in its entirety.

BACKGROUND

The recent trend in miniaturizing integrated circuits (ICs) has resulted in smaller devices which consume less power, yet provide more functionality at higher speeds than before. The miniaturization process has also increased the devices' susceptibility to electrostatic discharge (ESD) events due to various factors, such as thinner dielectric thicknesses and associated lowered dielectric breakdown voltages. ESD is one of the causes of electronic circuit damage and is also one of the considerations in semiconductor advanced technology.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 1 is a schematic block diagram of an integrated circuit, in accordance with some embodiments.

FIG. 2 is a schematic block diagram of an integrated circuit, in accordance with some embodiments.

FIG. 3A is a cross-sectional view of an integrated circuit, in accordance with some embodiments.

FIG. 3B is a cross-sectional view of an integrated circuit, in accordance with some embodiments.

FIG. 4 is a cross-sectional view of an integrated circuit, in accordance with some embodiments.

FIG. 5 is a flowchart of a method of operating an ESD circuit, in accordance with some embodiments.

FIG. 6 is a flowchart of a method of manufacturing an ESD circuit, in accordance with some embodiments.

FIGS. 7A-7E are cross-sectional views of an integrated circuit, in accordance with one or more embodiments.

DETAILED DESCRIPTION

The following disclosure provides different embodiments, or examples, for implementing features of the provided subject matter. Specific examples of components, materials, values, steps, arrangements, or the like, are described below to simplify the present disclosure. These are, of course, merely examples and are not limiting. Other components, materials, values, steps, arrangements, or the like, are contemplated. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In some embodiments, an ESD protection circuit includes a first diode, a second diode and an ESD clamp circuit. The first diode is in a semiconductor wafer, and is coupled to an input output (TO) pad. The second diode is in the semiconductor wafer, and is coupled to the first diode and the IO pad. The ESD clamp circuit is in the semiconductor wafer, and is coupled to the first diode and the second diode. The ESD clamp circuit includes a first signal tap region and a second signal tap region in the semiconductor wafer. The first signal tap region is coupled to a first voltage supply. The second signal tap region is coupled to a second voltage supply different from the first voltage supply.

The first diode is coupled to and configured to share the first signal tap region with the ESD clamp circuit. The second diode is coupled to and configured to share the second signal tap region with the ESD clamp circuit. In some embodiments, by the first diode sharing the first signal tap region with the ESD clamp circuit, and by the second diode sharing the second signal tap region with the ESD clamp circuit, the ESD protection circuit of the present disclosure occupies less area than other approaches.

In some embodiments, by the first diode sharing the first signal tap region with the ESD clamp circuit, and by the second diode sharing the second signal tap region with the ESD clamp circuit, the ESD protection circuit of the present disclosure has less signal taps than other approaches resulting in the ESD protection circuit of the present disclosure having less resistance than other approaches. In some embodiments, by having less resistance than other approaches, the ESD protection circuit of the present disclosure has a lower clamping voltage and is faster in operation than other approaches.

FIG. 1 is a schematic block diagram of an integrated circuit 100, in accordance with some embodiments.

Integrated circuit 100 comprises an internal circuit 102, a voltage supply node 104, a reference voltage supply node 106, an input/output (IO) pad 108, a diode D1, a diode D2, an IO circuit 110 and an ESD clamp circuit 120. In some embodiments, at least integrated circuit 100, 200 (FIG. 2) or 300A-300B (FIGS. 3A-3B) is incorporated on a single integrated circuit (IC), or on a single semiconductor substrate. In some embodiments, at least integrated circuit 100, 200 (FIG. 2) or 300A-300B (FIGS. 3A-3B) includes one or more ICs incorporated on one or more single semiconductor substrates.

Internal circuit 102 is coupled to the IO circuit 110. In some embodiments, internal circuit 102 is further coupled to IO pad 108, diode D1 and diode D2. Internal circuit 102 is configured to receive an IO signal from IO pad 108 through IO circuit 110. In some embodiments, internal circuit 102 is coupled to voltage supply node 104 (e.g. VDD) and reference voltage supply node 106 (e.g., VSS). In some embodiments, internal circuit 102 is configured to receive a supply voltage VDD from voltage supply node 104 (e.g. VDD), and a reference supply voltage VSS from reference voltage supply node 106 (e.g., VSS).

Internal circuit 102 includes circuitry configured to generate or process the IO signal received by or output to IO pad 108. In some embodiments, internal circuit 102 comprises core circuitry configured to operate at a voltage lower than supply voltage VDD of voltage supply node 104. In some embodiments, internal circuit 102 includes at least one n-type or p-type transistor device. In some embodiments, internal circuit 102 includes at least a logic gate cell. In some embodiments, a logic gate cell includes an AND, OR, NAND, NOR, XOR, INV, AND-OR-Invert (AOI), OR-AND-Invert (OAI), MUX, Flip-flop, BUFF, Latch, delay, or clock cells. In some embodiments, internal circuit 102 includes at least a memory cell. In some embodiments, the memory cell includes a static random access memory (SRAM), a dynamic RAM (DRAM), a resistive RAM (RRAM), a magnetoresistive RAM (MRAM) or read only memory (ROM). In some embodiments, internal circuit 102 includes one or more active or passive elements. Examples of active elements include, but are not limited to, transistors and diodes. Examples of transistors include, but are not limited to, metal oxide semiconductor field effect transistors (MOSFET), complementary metal oxide semiconductor (CMOS) transistors, bipolar junction transistors (BJT), high voltage transistors, high frequency transistors, p-channel and/or n-channel field effect transistors (PFETs/NFETs), FinFETs, and planar MOS transistors with raised source/drain. Examples of passive elements include, but are not limited to, capacitors, inductors, fuses, and resistors.

Voltage supply node 104 is coupled to diode D1 and ESD clamp circuit 120 at node Nd1. Reference voltage supply node 106 is coupled to diode D2 and ESD clamp circuit 120 at node Nd2. Voltage supply node 104 is configured to receive supply voltage VDD for normal operation of internal circuit 102. Similarly, reference voltage supply node 106 is configured to receive reference supply voltage VSS for normal operation of internal circuit 102. In some embodiments, at least voltage supply node 104 is a voltage supply pad. In some embodiments, at least reference voltage supply node 106 is a reference voltage supply pad. In some embodiments, a pad is at least a conductive surface, a pin, a node or a bus. Voltage supply node 104 or reference voltage supply node 106 is also referred to as a power supply voltage bus or rail. In the example configuration in FIG. 1, 2 or 3A-3B, supply voltage VDD is a positive supply voltage, voltage supply node 104 is a positive power supply voltage, reference supply voltage VSS is a ground supply voltage, and reference voltage supply node 106 is a ground voltage terminal. Other power supply arrangements are within the scope of the present disclosure.

IO pad 108 is coupled to IO circuit 110 by a node Nd3. IO pad 108 is coupled to internal circuit 102 by IO circuit 110. In some embodiments, IO circuit 110 is not included in integrated circuit 100, and IO pad is coupled to internal circuit 102 directly. IO pad 108 is configured to receive IO signal from IO circuit 110 or configured to output IO signal to IO circuit 110. IO pad 108 is at least a pin that is coupled to IO circuit 110 or internal circuit 102. In some embodiments, IO pad 108 is a node, a bus or a conductive surface that is coupled to IO circuit 110 or internal circuit 102.

Diode D1 is coupled between voltage supply node 104 and IO pad 108. Diode D1 is coupled between node Nd1 and node Nd3. An anode of diode D1 is coupled to node Nd3, IO circuit 110, IO pad 108 and a cathode of diode D2. A cathode of diode D1 is coupled to voltage supply node 104, ESD clamp circuit 120 and node Nd1. In some embodiments, the cathode of diode D1 is coupled to ESD clamp circuit 120 by node Nd1. In some embodiments, diode D1 is a pull-up diode or referred to as a p+ diode. For example, in these embodiments, the p+-diode is formed between a p-well region (e.g., well 322 of FIGS. 3A-3B) and an n-well region (not shown), and the n-well region is connected to VDD (See FIGS. 3A-3B). In some embodiments, diode D1 is a vertical well diode. Other diode types for diode D1 are within the scope of the present disclosure.

Diode D2 is coupled between reference voltage supply node 106 and IO pad 108. Diode D2 is coupled between node Nd3 and node Nd2. An anode of diode D2 is coupled to reference voltage supply node 106, ESD clamp circuit 120 and node Nd2. A cathode of diode D2 is coupled to node Nd3, IO circuit 110, IO pad 108 and the anode of diode D1. In some embodiments, diode D2 is a pull-down diode or referred to as an n+ diode. For example, in these embodiments, the n+-diode is formed between an n-well region (e.g., well 332 of FIGS. 3A-3B) and a p-well (not shown), and the P-substrate is connected to ground or VSS. In some embodiments, diode D2 is a vertical well diode. Other diode types for diode D2 are within the scope of the present disclosure.

Diodes D1 and D2 are configured to have a minimal impact on the normal behavior (e.g., no ESD conditions or events) of internal circuit 102 or integrated circuit 100. In some embodiments, an ESD event occurs when an ESD voltage or current higher than a level of voltage or current expected during the normal operation of internal circuit 102 is applied to at least voltage supply node 104, reference voltage supply node 106 or IO pad 108.

When no ESD events occur, diodes D1 and D2 do not affect the operation of integrated circuit 100. During an ESD event, diode D1 is configured to transfer voltage or current between voltage supply node 104 and IO pad 108 dependent upon whether diode D1 is forward biased or reverse biased, and the voltage levels of the voltage supply node 104 and IO pad 108.

For example, during a Positive-to-VDD (PD) mode of ESD stress or event, diode D1 is forward biased and is configured to transfer voltage or current from IO pad 108 to voltage supply node 104. In PD-mode, a positive ESD stress or ESD voltage (at least greater than supply voltage VDD) is applied to IO pad 108, while voltage supply node 104 (e.g., VDD) is ground and reference voltage supply node 106 (e.g., VSS) is floating.

For example, during a Negative-to-VDD (ND) mode of ESD stress or event, diode D1 is reverse biased and is configured to transfer voltage or current from voltage supply node 104 to IO pad 108. In ND-mode, a negative ESD stress is received by IO pad 108, while the voltage supply node 104 (e.g., VDD) is ground and reference voltage supply node 106 (e.g., VSS) is floating.

During an ESD event, diode D2 is configured to transfer voltage or current between reference voltage supply node 106 and IO pad 108 dependent upon whether diode D2 is forward biased or reverse biased, and the voltage levels of the reference voltage supply node 106 and IO pad 108.

For example, during a Positive-to-VSS (PS) mode of ESD stress or event, diode D2 is reverse biased and is configured to transfer voltage or current from IO pad 108 to reference voltage supply node 106. In PS-mode, a positive ESD stress or ESD voltage (at least greater than reference supply voltage VSS) is applied to IO pad 108, while voltage supply node 104 (e.g., VDD) is floating and reference voltage supply node 106 (e.g., VSS) is ground.

For example, during a Negative-to-VSS (NS) mode of ESD stress or event, diode D2 is forward biased and is configured to transfer voltage or current from reference voltage supply node 106 to IO pad 108. In NS-mode, a negative ESD stress is received by IO pad 108, while the voltage supply node 104 (e.g., VDD) is floating and reference voltage supply node 106 (e.g., VSS) is ground.

Other types of diodes, configurations and arrangements of at least diode D1 or D2 are within the scope of the present disclosure.

IO circuit 110 is coupled to IO pad 108, internal circuit 102, diodes D1 and D2 and node Nd3. IO circuit is coupled between node Nd3 and internal circuit 102. In some embodiments, IO circuit is an IO buffer configured to buffer signals sent to or from internal circuit 102. In some embodiments, IO circuit 110 includes at least the logic gate cell described above. Other types of circuits, configurations and arrangements of IO circuit 110 are within the scope of the present disclosure.

ESD clamp circuit 120 is coupled between voltage supply node 104 (e.g. supply voltage VDD) and reference voltage supply node 106 (e.g., VSS). ESD clamp circuit 120 is coupled between node Nd1 and node Nd2. ESD clamp circuit 120 is coupled to diode D1 by node Nd1. ESD clamp circuit 120 is coupled to diode D2 by node Nd2.

When no ESD event occurs, ESD clamp circuit 120 is turned off. For example, when no ESD event occurs, ESD clamp circuit 120 is turned off, and is therefore a nonconductive device or circuit during the normal operation of internal circuit 102. In other words, ESD clamp circuit 120 is turned off or is non-conductive in the absence of an ESD event.

If an ESD event occurs, ESD clamp circuit 120 is configured to sense the ESD event, and is configured to turn on and provide a current shunt path between voltage supply node 104 (e.g. supply voltage VDD) or node Nd1 and reference voltage supply node 106 (e.g., VSS) or node Nd2 to thereby discharge the ESD current. For example, when an ESD event occurs, the voltage difference across the ESD clamp circuit 120 is equal to or greater than a threshold voltage of ESD clamp circuit 120, and ESD clamp circuit 120 is turned on thereby conducting current between voltage supply node 104 (e.g. VDD) and reference voltage supply node 106 (e.g., VSS).

During an ESD event, ESD clamp circuit 120 is configured to turn on and discharge an ESD current in a forward ESD direction (e.g., current I1a) from the reference voltage supply node 106 (e.g., VSS) to the voltage supply node 104 (e.g. VDD). Current I1a is shown in FIG. 1 between node Nd2 to node Nd1 for simplicity, but it is understood that current I1a is from the reference voltage supply node 106 (e.g., VSS) to the voltage supply node 104 (e.g. VDD).

During an ESD event, ESD clamp circuit 120 is configured to turn on and discharge an ESD current in a reverse ESD direction (e.g., current I1a) from the voltage supply node 104 (e.g. VDD) to the reference voltage supply node 106 (e.g., VSS). Current I1a is shown in FIG. 1 between node Nd1 to node Nd2 for simplicity, but it is understood that current I1a is from the voltage supply node 104 (e.g. VDD) to the reference voltage supply node 106 (e.g., VSS).

During a positive ESD surge on reference voltage supply node 106, ESD clamp circuit 120 is configured to turn on and discharge the ESD current I1a in a forward ESD direction from the reference voltage supply node 106 (e.g., VSS) to the voltage supply node 104 (e.g. VDD). In some embodiments, ESD clamp circuit 120 is configured to turn on, after a PS mode (described above) of ESD, and discharge the ESD current I1 in the forward ESD direction from node Nd3 to node Nd2, and from node Nd2 to the voltage supply node 104 (e.g. VDD) by node Nd1.

During a positive ESD surge on voltage supply node 104, ESD clamp circuit 120 is configured to turn on and discharge the ESD current I1a in a reverse ESD direction from voltage supply node 104 (e.g. VDD) to reference voltage supply node 106 (e.g., VSS). In some embodiments, ESD clamp circuit 120 is configured to turn on, after a PD mode (described above) of ESD, and discharge the ESD current I2 in the reverse ESD direction from node Nd3 to node Nd1, and from node Nd1 to the reference voltage supply node 106 (e.g., VSS) by node Nd2.

In some embodiments, ESD clamp circuit 120 is a transient clamp. For example, in some embodiments, ESD clamp circuit 120 is configured to handle transient or ESD events, e.g., rapid changes in voltage and/or current from the ESD event. During the transient or ESD, the ESD clamp circuit 120 is configured to turn on to provide a shunt path between voltage supply node 104 (e.g. supply voltage VDD) and reference voltage supply node 106 (e.g., VSS) before the ESD event can cause damage to one or more elements within integrated circuit 100. In some embodiments, ESD clamp circuit 120 is configured to turn off slower than it turns on.

In some embodiments, ESD clamp circuit 120 is a static clamp. In some embodiments, static clamps are configured to provide a static or steady-state voltage and current response. For example, static clamps are turned-on by a fixed voltage level.

In some embodiments, ESD clamp circuit 120 includes a large NMOS transistor configured to carry the ESD current without entering the avalanche breakdown region of the ESD clamp circuit 120. In some embodiments, ESD clamp circuit 120 is implemented without having avalanching junctions inside ESD clamp circuit 120, and is also known as a "non-snapback protection scheme."

Other types of clamp circuits, configurations and arrangements of ESD clamp circuit 120 are within the scope of the present disclosure.

Other configurations or quantities of circuits in integrated circuit 100 are within the scope of the present disclosure.

Figure 2:
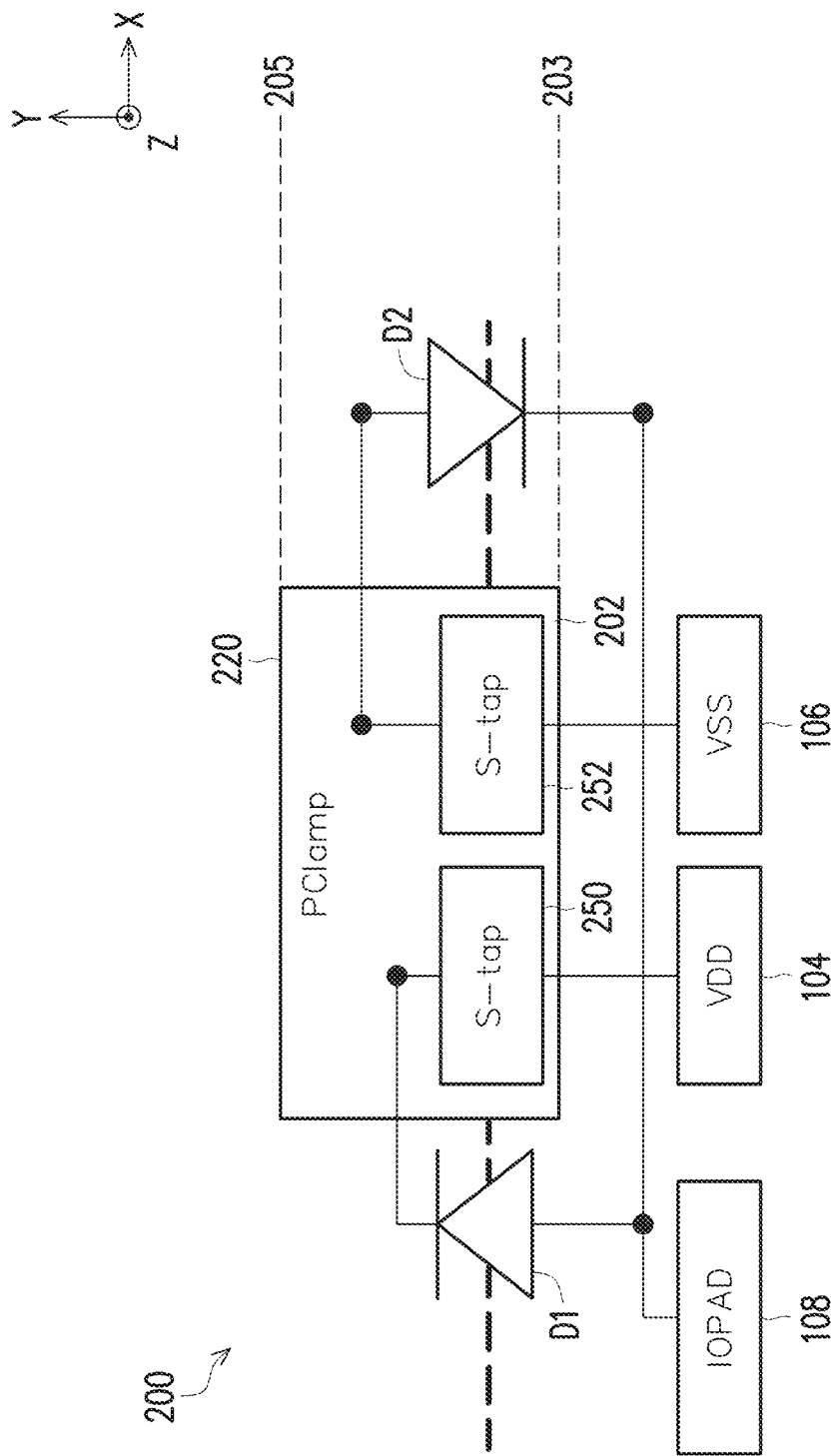

FIG. 2 is a schematic block diagram of an integrated circuit 200, in accordance with some embodiments.

Integrated circuit 200 is an embodiment of integrated circuit 100, and similar detailed description is therefore omitted. For example, integrated circuit 200 includes at least a portion of integrated circuit 100 included as part of a substrate 202. While integrated circuit 200 of FIG. 2 shows a portion of integrated circuit 100, it is understood that integrated circuit 200 can be modified to include each of the features of integrated circuit 100, and similar detailed description is therefore omitted for brevity.

Components that are the same or similar to those in one or more of FIGS. 1, 2, 3A-3B and 4 (shown below) are given the same reference numbers, and detailed description thereof is thus omitted.

Integrated circuit 200 includes voltage supply node 104, reference voltage supply node 106, IO pad 108, diode D1, diode D2, substrate 202 and a clamp circuit 220.

Integrated circuit 200 is a variation of integrated circuit 100 of FIG. 1, and similar detailed description is therefore omitted. In comparison with integrated circuit 100, ESD clamp circuit 220 replaces ESD clamp circuit 120 of FIG. 1, and similar detailed description is therefore omitted.

ESD clamp circuit 220 are formed on substrate 202. Substrate 202 extends in a first direction X. Substrate 202 has a backside 203 and a front side 205 opposite from the backside 203 in a second direction Y. In some embodiments, the second direction Y is different from the first direction X. In some embodiments, a bulk of substrate 202 has been removed during wafer thinning. In some embodiments, substrate 202 is part of a super power rail (SPR) technology or process. In some embodiments, substrate 202 is a silicon on insulator (SOI) technology or process. In some embodiments, at least diode D1 or D2 is formed on substrate 202. Other types of substrate technology or processes for substrate 202 are within the scope of the present disclosure.

ESD clamp circuit 220 includes a signal tap 250 and a signal tap 252.

In some embodiments, at least signal tap 252 corresponds to a well tap. In some embodiments, a well tap is an electrically conductive lead that couples a well region (shown in FIG. 3A-3B) of substrate 202 to voltage supply node 104 (e.g., supply voltage VDD). For example, in some embodiments, the well region includes a heavily doped n-region in an n-type well on a p-type substrate. In some embodiments, the heavily doped n-region is coupled through the well tap to voltage supply node 104 (e.g., supply voltage VDD) thereby setting the potential of the n-type well to prevent leakage from adjacent source/drain regions into the well.

In some embodiments, at least signal tap 250 corresponds to a substrate tap. In some embodiments, a substrate tap is an electrically conductive lead that couples a region of substrate 202 to reference voltage supply node 106 (e.g., reference supply voltage VSS). For example, in some embodiments, the region of substrate 202 includes a heavily doped p-region which is formed in a p-type substrate. In some embodiments, the heavily doped p-region is coupled through the substrate tap to the reference voltage supply node 106 (e.g., reference supply voltage VSS) thereby setting the potential of the substrate 202 to prevent leakage from adjacent source/drain regions.

Through the use of signal taps 250 and 252 the resistance of substrate 202 and undesirable positive feedback in integrated circuit 200 are reduced. In some embodiments, at least signal tap 250 or 252 is configured to limit a resistance between power or ground connections to wells (shown in FIGS. 3A-3B) of substrate 202. In some embodiments, the use of at least signal tap 250 or 252 results in less drift in substrate 202 thereby preventing latch-up effects.

Signal tap 250 is coupled to the voltage supply node 104 (e.g., voltage VDD) on the backside 203 of substrate 202. Signal tap 250 is further coupled to the cathode of diode D1.

Signal tap 252 is coupled to the reference voltage supply node 106 (e.g., voltage VSS) on the backside 203 of substrate 202. Signal tap 252 is further coupled to the anode of diode D2.

IO pad 108 is on the backside 203 of substrate 202, and is coupled to the anode of diode D1 and the cathode of diode D2. In some embodiments, integrated circuit 200 is electrically connected to one or more other package structures (not shown) on the backside 203 of substrate 202.

In some embodiments, diode D1 is configured to share signal tap 250 with ESD clamp circuit 220, and diode D2 is configured to share signal tap 252 with ESD clamp circuit 220. In some embodiments, by sharing signal tap 250 with ESD clamp circuit 220, diode D1 does not include a signal tap resulting in integrated circuit 200 occupying less area than other approaches. In some embodiments, by sharing signal tap 252 with ESD clamp circuit 220, diode D2 does not include a signal tap resulting in integrated circuit 200 occupying less area than other approaches.

By at least diode D1 or D2 not including corresponding signal taps, integrated circuit 200 has less resistance since integrated circuit 200 includes fewer signal taps than other approaches.

Other types of clamp circuits, configurations and arrangements of ESD clamp circuit 120 are within the scope of the present disclosure.

Other configurations or quantities of circuits in integrated circuit 200 are within the scope of the present disclosure.

Figure 3A:
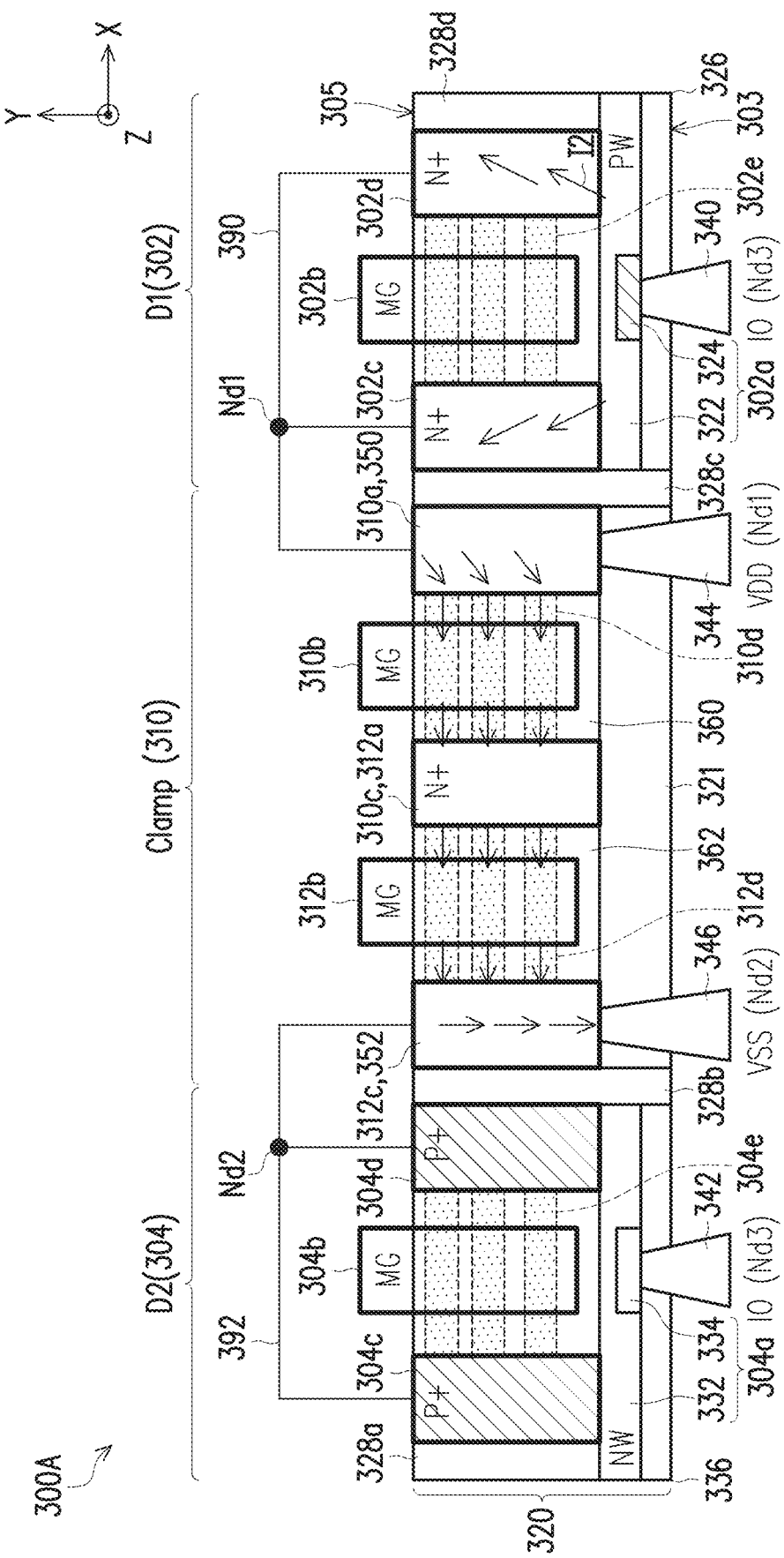

FIG. 3A is a cross-sectional view of an integrated circuit 300A, in accordance with some embodiments.

Integrated circuit 300A is an embodiment of at least integrated circuit 100 of FIG. 1 or integrated circuit 200 of FIG. 2, and similar detailed description is therefore omitted.

Figure 3B:
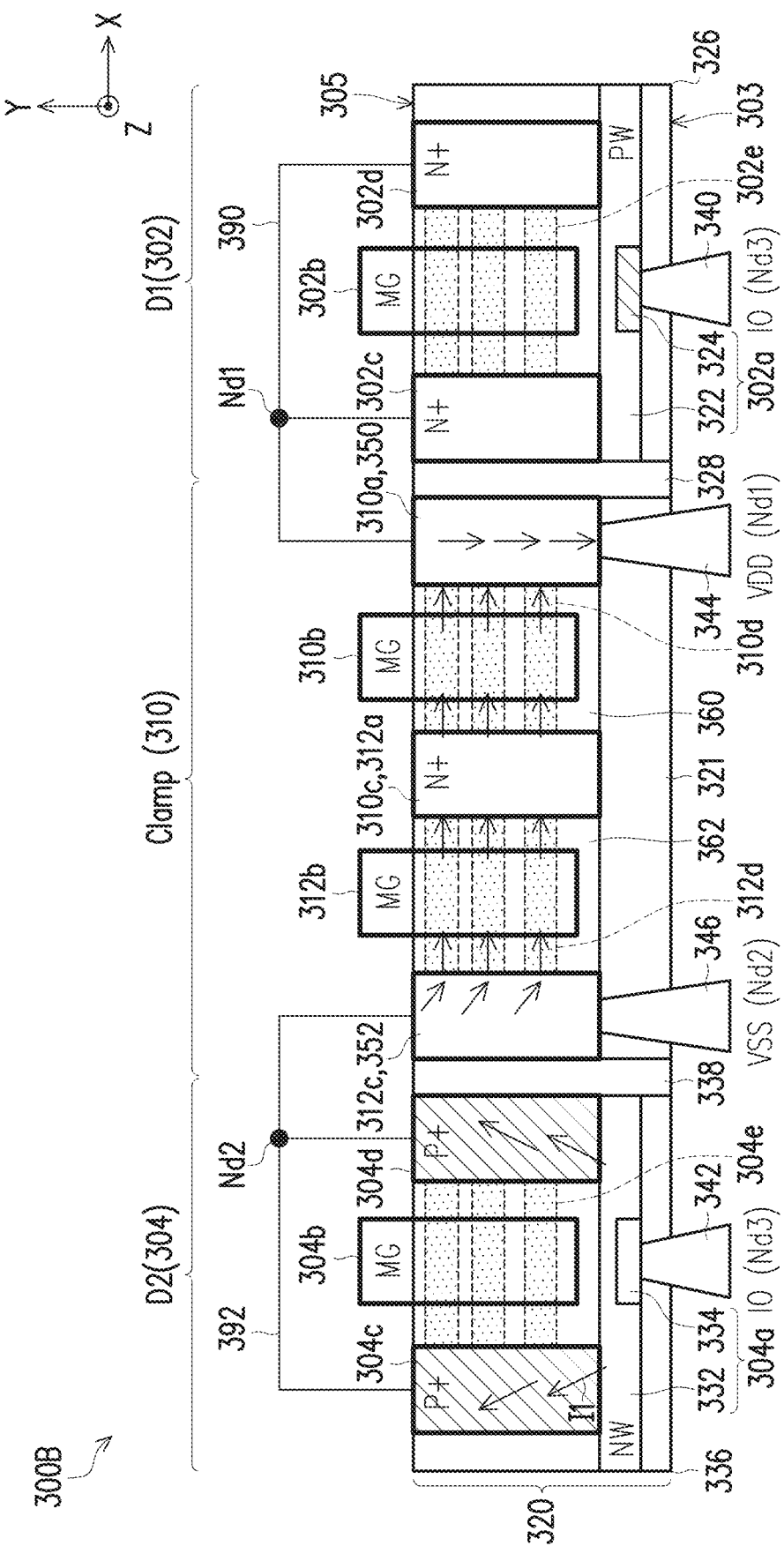

While FIGS. 3A-3B are described with respect to a portion of integrated circuit 100 of FIG. 1 or integrated circuit 200 of FIG. 2, the teachings of FIGS. 3A-3B are also applicable to other portions of integrated circuit 100 or 200 (not described with respect to at least FIGS. 3A-3B), and similar detailed description is therefore omitted for brevity.

Integrated circuit 300A includes a diode 302, a diode 304, an ESD clamp circuit 310 and a substrate 320.

Diode 302 is an embodiment of diode D1 of FIGS. 1-2, diode 304 is an embodiment of diode D2 of FIGS. 1-2, ESD clamp circuit 310 is an embodiment of ESD clamp circuit 120 of FIG. 1 or 210 of FIG. 2, and substrate 320 is an embodiment of substrate 202 of FIG. 2, and similar detailed description is therefore omitted.

At least diode 302, diode D2 or ESD clamp circuit 310 is formed on substrate 320. In some embodiments, at least diode 302, diode D2 or ESD clamp circuit 310 is formed on a front side 305 of substrate 320.

Substrate 320 has a front side 305 and a backside 303 opposite from the front side 305 in a second direction Y. Substrate 320 has a side 326 and a side 336 opposite from side 326 in the first direction X. In some embodiments, a bulk of substrate 320 has been removed during wafer thinning. In some embodiments, substrate 320 is part of a super power rail (SPR) technology or process. In some embodiments, substrate 320 is a silicon on insulator (SOI) technology or process. In some embodiments, substrate 320 is also referred to as a wafer. In some embodiments, substrate 320 includes an insulating layer 321. Insulating layer 321 is between the back-side 303 and front-side 305 of substrate 320. In some embodiments, the insulating layer 321 is a non-conducting oxide material. In some embodiments, the insulating layer 321 is formed on the back-side 303 of substrate 320 after wafer thinning and oxide regrowth. In some embodiments, the front-side 305 and the back-side 303 are electrically isolated from each other by at least the insulating layer 321. In some embodiments, the insulating layer 321 includes a dielectric material including oxide or another suitable insulating material.

Substrate 320 is a p-type substrate. In some embodiments, substrate 320 is an n-type substrate. In some embodiments, substrate 320 includes an elemental semiconductor including silicon or germanium in crystal, polycrystalline, or an amorphous structure; a compound semiconductor including silicon carbide, gallium arsenic, gallium phosphide, indium phosphide, indium arsenide, and indium antimonide; an alloy semiconductor including SiGe, GaAsP, AlInAs, AlGaAs, GaInAs, GaInP, and GaInAsP; any other suitable material; or combinations thereof. In some embodiments, the alloy semiconductor substrate has a gradient SiGe feature in which the Si and Ge composition change from one ratio at one location to another ratio at another location of the gradient SiGe feature. In some embodiments, the alloy SiGe is formed over a silicon substrate. In some embodiments, substrate 320 is a strained SiGe substrate. In some embodiments, the semiconductor substrate has a semiconductor on insulator structure, such as a silicon on insulator (SOI) structure. In some embodiments, the semiconductor substrate includes a doped epi layer or a buried layer. In some embodiments, the compound semiconductor substrate has a multilayer structure, or the substrate includes a multilayer compound semiconductor structure.

Diode 302 includes an anode 302a, a gate structure 302b, a cathode 302c, a cathode 302d, a channel region 302e and a well 322. Diode 302 is a vertical well diode. In some embodiments, diode 302 is a nanosheet vertical well diode. In some embodiments, diode 302 is formed on a front side 305 of substrate 320. Other diode types for diode 302 are within the scope of the present disclosure.

Diode 302 corresponds to diode D1 of FIGS. 1-2, and similar detailed description is omitted. Anode 302a corresponds to the anode of diode D1 of FIGS. 1-2, cathodes 302c and 302d corresponds to the cathode of diode D1 of FIGS. 1-2, and the channel region 302e corresponds to a channel region of diode D1, and similar detailed description is omitted.

Well 322 is formed in substrate 320. Well 322 has p-type dopant impurities and is referred to as a P-type well. In some embodiments, well 322 has n-type dopant impurities and is referred to as an N-type well.

Well 322 includes a region 324. Region 324 is embedded in well 322. Region 324 is a heavily doped p-region. In some embodiments, region 324 is a heavily doped n-region.

The anode 302a includes well 322 and region 324. The anode 302a is a P-type active region having P-type dopants in well 322.

The cathode 302c is an N-type active region having N-type dopants and is located on well 322. The cathode 302d is an N-type active region having N-type dopants and is located on well 322. In some embodiments, at least cathode 302c or 302d is a P-type active region having P-type dopants. The cathode 302c and the cathode 302d are separated from each other in the first direction X. In some embodiments, cathode 302c and cathode 302d are corresponding cathodes of two diodes coupled together in parallel. Integrated circuits 300A-300B are shown with two cathodes (e.g., cathodes 302c and 302d) and a single anode (e.g., anode 302a). Other number of cathodes 302c or 302d and/or anodes 302a are within the scope of the present disclosure.

The anode 302a and the cathode 302c together form a PN junction, and the anode 302a and the cathode 302d together form another PN junction. In some embodiments, at least cathode 302c or cathode 302d extends above substrate 320. In some embodiments, at least a top surface of cathode 302c or a top surface of cathode 302d is flush with the front side 305 of substrate 320.

The gate structure 302b is at least partially over well 322, and in between cathode 302c and cathode 302d. In some embodiments, the gate structure 302b is electrically floating. In some embodiments, the gate structure 302b is electrically coupled to cathodes 302c and 302d. The channel region 302e couples the cathode 302c and the cathode 302d. In some embodiments, the channel region 302e is in well 322.

In some embodiments, diode 302 does not include a signal tap region. In some embodiments, diode 302 is configured to share a signal tap region 350 with ESD clamp circuit 310. For example, in some embodiments, diode 302 is electrically coupled to the signal tap region 350 of ESD clamp circuit 310 by at least a conductive structure 390. In some embodiments, by sharing signal tap region 350 with ESD clamp circuit 310, integrated circuit 300A or 300B occupies less area than other approaches. In some embodiments, by sharing signal tap region 350 with ESD clamp circuit 310, integrated circuit 300A or 300B has less signal taps than other approaches resulting in integrated circuit 300A or 300B having less resistance than other approaches, and simpler routing.

Other types of circuits, configurations and arrangements of diode 302 are within the scope of the present disclosure.

Diode 304 includes an anode 304a, a gate structure 304b, a cathode 304c, a cathode 304d, a channel region 304e and a well 332. Diode 304 is a vertical well diode. In some embodiments, diode 304 is a nanosheet vertical well diode. In some embodiments, diode 304 is formed on a front side 305 of substrate 320. Other diode types for diode 304 are within the scope of the present disclosure.

Diode 304 corresponds to diode D2 of FIGS. 1-2, and similar detailed description is omitted. Anode 304a corresponds to the anode of diode D2 of FIGS. 1-2, cathodes 304c and 304d corresponds to the cathode of diode D2 of FIGS. 1-2, and the channel region 304e corresponds to a channel region of diode D2, and similar detailed description is omitted.

Well 332 is formed in substrate 320. Well 332 has n-type dopant impurities and is referred to as an N-type well. In some embodiments, well 332 has p-type dopant impurities and is referred to as a P-type well.

Well 332 includes a region 334. Region 334 is embedded in well 332. Region 334 is a heavily doped n-region. In some embodiments, region 334 is a heavily doped p-region.

The anode 304a includes well 332 and region 334. The anode 304a is an N-type active region having N-type dopants in well 332.

The cathode 304c is a P-type active region having P-type dopants and is located on well 332. The cathode 304d is a P-type active region having P-type dopants and is located on well 332. In some embodiments, at least cathode 304c or 304d is an N-type active region having N-type dopants. The cathode 304c and the cathode 304d are separated from each other in the first direction X. In some embodiments, cathode 304c and cathode 304d are corresponding cathodes of two diodes coupled together in parallel. Integrated circuits 300A-300B are shown with two cathodes (e.g., cathodes 304c and 304d) and a single anode (e.g., anode 304a). Other number of cathodes 304c or 304d and/or anodes 304a are within the scope of the present disclosure.

The anode 304a and the cathode 304c together form a PN junction, and the anode 304a and the cathode 304d together form another PN junction. In some embodiments, at least cathode 304c or cathode 304d extends above substrate 320. In some embodiments, at least a top surface of cathode 304c or a top surface of cathode 304d is flush with the front side 305 of substrate 320.

The gate structure 304b is at least partially over well 332, and in between cathode 304c and cathode 304d. In some embodiments, the gate structure 304b is electrically floating. In some embodiments, the gate structure 304b is electrically coupled to cathodes 304c and 304d. The channel region 304e couples the cathode 304c and the cathode 304d. In some embodiments, the channel region 304e is in well 332.

In some embodiments, diode 304 does not include a signal tap region. In some embodiments, diode 304 is configured to share a signal tap region 352 with ESD clamp circuit 310. For example, in some embodiments, diode 304 is electrically coupled to the signal tap region 352 of ESD clamp circuit 310 by at least a conductive structure 392. In some embodiments, by sharing signal tap region 352 with ESD clamp circuit 310, integrated circuit 300A or 300B occupies less area than other approaches. In some embodiments, by sharing signal tap region 352 with ESD clamp circuit 310, integrated circuit 300A or 300B has less signal taps than other approaches resulting in integrated circuit 300A or 300B having less resistance than other approaches, and simpler routing.

Other types of circuits, configurations and arrangements diode 304 are within the scope of the present disclosure.

ESD clamp circuit 310 includes an N-type Metal Oxide Semiconductor (NMOS) transistor N1, an NMOS transistor N2, signal tap region 250 and signal tap region 252. NMOS transistor N1 is coupled in series with NMOS transistor N2. For ease of illustration, NMOS transistor N1 and NMOS transistor N2 are not shown as being coupled to other elements in FIGS. 3A-3B. In some embodiments, at least NMOS transistor N1 or N2 is a P-type Metal Oxide Semiconductor (PMOS) transistor.

NMOS transistor N1 includes a drain region 310a, a gate structure 310b, a source region 310c, a channel region 310d and a well region 360.

Well region 360 is formed in substrate 320. Well region 360 has p-type dopant impurities and is referred to as a P-type well. In some embodiments, well region 360 has n-type dopant impurities and is referred to as an N-type well.

The gate structure 310b is over well region 360. The drain region 310a is an N-type active region having N-type dopants implanted in well region 360. The source region 310c is an N-type active region having N-type dopants implanted in well region 360. In some embodiments, at least source region 310c or drain region 310a extends above substrate 320. The channel region 310d is in well region 360 and couples the drain region 310a and the source region 310c.

NMOS transistor N2 includes a drain region 312a, a gate structure 312b, a source region 312c, a channel region 312d and a well region 362.

Well region 362 is formed in substrate 320. Well region 362 has p-type dopant impurities and is referred to as a P-type well. In some embodiments, well region 362 has n-type dopant impurities and is referred to as an N-type well.

The gate structure 312b is over well region 362. The drain region 312a is an N-type active region having N-type dopants implanted in well region 362. The source region 312c is an N-type active region having N-type dopants implanted in well region 362. In some embodiments, at least source region 312c or drain region 312a extends above substrate 320. The channel region 312d is in well region 362 and couples the drain region 312a and the source region 312c.

The signal tap region 350 is an embodiment of signal tap region 250 of FIG. 2, and the signal tap region 352 is an embodiment of signal tap region 252 of FIG. 2, and similar detailed description is therefore omitted.

The signal tap region 350 is in well region 360. Signal tap region 350 is coupled to a conductive structure 344. Each of signal tap region 350 and conductive structure 344 are coupled to node Nd1 which corresponds to the voltage supply terminal (e.g., voltage VDD). Signal tap region 350 is further coupled to cathode 302c of diode D1 and cathode 302d of diode D1 by a conductive line 390. In some embodiments, the signal tap region 350 of ESD clamp circuit 310 is shared with diode 302.

In some embodiments, signal tap region 350 is a well tap, and electrically couples well region 360 of substrate 320 to voltage supply node 104 (e.g., supply voltage VDD). In some embodiments, the signal tap region 350 includes a heavily doped n-region in well region 360 on substrate 320 (e.g., P-type). In some embodiments, the heavily doped n-region is coupled through the well tap to voltage supply node 104 (e.g., supply voltage VDD) thereby setting the potential of the well region 360 (e.g., N-type) to prevent leakage from adjacent source/drain regions into well region 360. In some embodiments, the signal tap region 350 includes a heavily doped p-region in well region 360 on substrate 320.

The signal tap region 352 is in well region 362. In some embodiments, well region 362 and 360 are part of a same continuous well. In some embodiments, well region 362 and 360 are separate discontinuous wells. Signal tap region 352 is coupled to a conductive structure 346. Each of signal tap region 352 and conductive structure 346 are coupled to node Nd2 which corresponds to the reference voltage supply terminal (e.g., voltage VSS). Signal tap region 352 is further coupled to cathode 304c of diode D2 and cathode 304d of diode D2 by a conductive line 392. In some embodiments, signal tap region 352 of ESD clamp circuit 310 is shared with diode 304.

In some embodiments, signal tap region 352 is a substrate tap, and electrically couples well region 362 of substrate 320 to reference voltage supply node 106 (e.g., supply voltage VSS). In some embodiments, the signal tap region 352 includes a heavily doped p-region in well region 362 on substrate 320 (e.g., P-type). In some embodiments, the heavily doped p-region is coupled through the substrate tap to reference voltage supply node 106 (e.g., supply voltage VSS) thereby setting the potential of the substrate 320 (e.g., P-type) to prevent leakage from adjacent source/drain regions. In some embodiments, the signal tap region 352 includes a heavily doped n-region in well region 362 on substrate 320.

Each of the cathode 302c of diode D1, the cathode 302d of diode D1, and the signal tap region 350 are coupled together by conductive line 390 that corresponds to node Nd1 of FIGS. 1-2.

Each of the cathode 304c of diode D2, the cathode 304d of diode D2, and the signal tap region 352 are coupled together by conductive line 392 that corresponds to node Nd2 of FIGS. 1-2.

In some embodiments, the drain region 310a and source region 310c or the drain region 312a and source region 312c of ESD clamp circuit 310 of FIGS. 3A-3B is referred to as an oxide definition (OD) region which defines the source or drain diffusion regions of NMOS transistor N1 or N2 of FIGS. 3A-3B.

In some embodiments, at least drain region 310a or 312a is an extended drain region and has a greater size than at least source region 310c or 312c. In at least one embodiment, a silicide layer (not shown) covers a portion, but not the entirety, of at least drain region 310a or 312a. Such a partially silicided configuration of drain region 310a improves self-protection of NMOS transistor N1 or N2 of ESD clamp circuit 310 from ESD events. In at least one embodiment, at least drain region 310a or 312a is fully silicided.

Gate structure 310b is arranged between drain region 310a and source region 310c. Gate structure 312b is arranged between drain region 312a and source region 312c. In some embodiments, the gate structure 310b and gate structure 312b are electrically coupled together.

In some embodiments, at least gate structure 302b, 304b, 310b or 312b is a metal gate, and includes a conductive material such as a metal. In some embodiments, at least gate structure 302b, 304b, 310b or 312b includes polysilicon (also referred to herein as "POLY").

In some embodiments, at least channel region 302e, 304e, 310d or 312d includes fins in accordance with fin field-effect transistor (FinFET) complementary metal-oxide-semiconductor (CMOS) technologies. In some embodiments, at least channel region 302e, 304e, 310d or 312d includes nanosheets of nanosheet transistors. In some embodiments, at least channel region 302e, 304e, 310d or 312d includes nanowire of nanowire transistors. In some embodiments, at least channel region 302e, 304e, 310d or 312d is free of fins in accordance with planar CMOS technologies. Other types of transistors are within the scope of the present disclosure.

Other types of circuits, configurations and arrangements of ESD clamp circuit 310 are within the scope of the present disclosure.

Integrated circuit 300A further includes one or more shallow trench isolation (STI) regions 328a, 328b, 328c or 328d.

STI region 328a is adjacent to anode 304a of diode 304. STI region 328b is between diode 302 and ESD clamp circuit 310. STI region 328c is between diode 304 and ESD clamp circuit 310. STI region 328d is adjacent to cathode 302d of diode 302.

STI region 328a is configured to electrically isolate portions of diode 304 from other portions of integrated circuit 300A or 300B (not shown). STI region 328b is configured to electrically isolate portions of diode 304 and portions of ESD clamp circuit 310 from each other. In some embodiments, STI region 328c is configured to electrically isolate at least portions of diode 302 and portions of ESD clamp circuit 310 from each other. STI region 328d is configured to electrically isolate portions of diode 302 from other portions of integrated circuit 300A or 300B (not shown).

In some embodiments, at least STI region 328a, 328b, 328c or 328d is not included in integrated circuit 300A or 300B. In some embodiments, in at least integrated circuit 300A or 300B, at least STI region 328a, 328b, 328c or 328d is replaced with a corresponding dummy cell. In some embodiments, the dummy cell is a dummy device. In some embodiments, a dummy device is a non-functional transistor or non-functional diode device.

In some embodiments, well region 322 and well region 360 are part of a same continuous well. In some embodiments, well region 322 and 360 are separate discontinuous wells, and STI region 328 is positioned between them.

In some embodiments, well region 332 and well region 362 are part of a same continuous well. In some embodiments, well region 322 and 362 are separate discontinuous wells, and STI region 338 is positioned between them.

In some embodiments, well region 360 is positioned between well region 362 and well region 322. In some embodiments, well region 360 is adjacent to at least well region 362 or well region 322. In some embodiments, a first element is adjacent to a second element corresponds to the first element being directly next to the second element. In some embodiments, the first element is adjacent to the second element corresponds to the first element not being directly next to the second element. In some embodiments, diode 302 is adjacent to ESD clamp circuit 310. In some embodiments, signal tap region 350 is adjacent to cathode 302c.

In some embodiments, well region 362 is positioned between well region 360 and well region 332. In some embodiments, well region 362 is adjacent to at least well region 360 or well region 332. In some embodiments, diode 304 is adjacent to ESD clamp circuit 310. In some embodiments, signal tap region 352 is adjacent to cathode 304c.

Other types of circuits, configurations and arrangements of ESD clamp circuit 310 are within the scope of the present disclosure.

Integrated circuit 300A further includes a conductive structure 340, a conductive structure 342, a conductive structure 344 and a conductive structure 346. Conductive structure 340, conductive structure 342, conductive structure 344 and conductive structure 346 are formed on the backside 203 of integrated circuits 300A-300B. In some embodiments, at least conductive structure 340, conductive structure 342, conductive structure 344 or conductive structure 346 is embedded in substrate 320. In some embodiments, at least conductive structure 340, conductive structure 342, conductive structure 344 or conductive structure 346 is configured to provide an electrical connection between one or more circuit elements of integrated circuit 300A-300B and other one or more circuit elements of integrated circuit 300A-300B or other package structures (not shown).

In some embodiments, each of conductive structure 340, conductive structure 342 and conductive structure 344 and conductive structure 346 is a corresponding via. In some embodiments, one or more of conductive structure 340, conductive structure 342 and conductive structure 344, conductive structure 346 or signal tap 350 are used to electrically couple signals from the front-side 305 to the back-side 303 of substrate 320 since the front-side 305 and the back-side 303 are electrically isolated from each other by at least the insulating layer 321. In some embodiments, at least conductive structure 340, 342, 344 or 346 is directly coupled with corresponding source/drain region 310a, 310c or 312c.

In some embodiments, integrated circuit 300A is electrically connected to one or more other package structures (not shown) on the backside 203 of substrate 320 by at least conductive structure 340, conductive structure 342, conductive structure 344 or conductive structure 346.

In some embodiments, at least conductive structure 340, conductive structure 342, conductive structure 344 or conductive structure 346 corresponds to a copper pillar structure that includes at least a conductive material such as copper, or the like.

In some embodiments, at least conductive structure 340, conductive structure 342, conductive structure 344 or conductive structure 346 corresponds to a solder bump structure that includes a conductive material having a low resistivity, such as solder or a solder alloy. In some embodiments, a solder alloy includes Sn, Pb, Ag, Cu, Ni, Bi, or combinations thereof. Other configurations, arrangements and materials of at least conductive structure 340, conductive structure 342, conductive structure 344 or conductive structure 346 are within the contemplated scope of the present disclosure.

Conductive structure 340 is coupled to the anode region 302a of diode 302. Conductive structure 340 is coupled to the well region 322 and region 324 of diode 302. In some embodiments, conductive structure 340 corresponds to node Nd3 of FIGS. 1-2. In some embodiments, conductive structure 340 is electrically coupled to node Nd3 of FIGS. 1-2. In some embodiments, conductive structure 340 is electrically coupled to IO pad 108 of FIGS. 1-2.

Conductive structure 342 is coupled to the anode region 304a of diode 304. Conductive structure 342 is coupled to the well region 332 and region 334 of diode 304. In some embodiments, conductive structure 342 corresponds to node Nd3 of FIGS. 1-2. In some embodiments, conductive structure 342 is electrically coupled to node Nd3 of FIGS. 1-2. In some embodiments, conductive structure 342 is electrically coupled to IO pad 108 of FIGS. 1-2.

In some embodiments, conductive structure 340 and conductive structure 342 are coupled to each other. For ease of illustration, conductive structure 340 and conductive structure 342 are not shown as being coupled to each other.

Conductive structure 344 is coupled to signal tap region 350. Conductive structure 344 is configured to provide voltage VDD to signal tap region 350. In some embodiments, conductive structure 344 is electrically coupled to voltage supply node 104 (e.g., voltage VDD) of FIGS. 1-2. In some embodiments, conductive structure 344 corresponds to node Nd1 of FIGS. 1-2. In some embodiments, conductive structure 344 corresponds to a pad or a pin. In some embodiments, conductive structure 344 is electrically coupled to node Nd1 of FIGS. 1-2. In some embodiments, conductive structure 344 corresponds to node Nd1 of FIGS. 1-2.

Conductive structure 346 is coupled to signal tap region 352. Conductive structure 346 is configured to provide voltage VSS to signal tap region 352. In some embodiments, conductive structure 346 is electrically coupled to reference voltage supply node 106 (e.g., voltage VSS) of FIGS. 1-2. In some embodiments, conductive structure 346 corresponds to node Nd2 of FIGS. 1-2. In some embodiments, conductive structure 346 corresponds to a pad or a pin. In some embodiments, conductive structure 346 is electrically coupled to node Nd2 of FIGS. 1-2. In some embodiments, conductive structure 346 corresponds to node Nd2 of FIGS. 1-2.

In some embodiments, at least conductive structure 340, 342, 344, 346, 390 or 392 includes one or more layers of a conductive material. In some embodiments, the conductive material includes Tungsten, Cobalt, Ruthenium, Copper, or the like or combinations thereof.

Other configurations, arrangements and materials of at least conductive structure 340, 342, 344, 346, 390 or 392 are within the contemplated scope of the present disclosure.

Other configurations or quantities of circuits in integrated circuit 300A are within the scope of the present disclosure.

During a PD mode of ESD stress or event, diode 302 is forward biased and current I2 flows through diode 302 from the anode 302a to the cathode 302c and cathode 302d. Diode 302 is configured to transfer current I2 or ESD voltage from IO pad 108 (node Nd3) to node Nd1. Current I2 flows directly from cathode 302c and cathode 302d to signal tap region 350 of ESD clamp circuit 302. In response to current I2 and ESD voltage at node Nd1, NMOS transistors N1 and N2 in ESD clamp circuit 310 are configured to turn on, and discharge the ESD current I2 from signal tap region 350 or node Nd1 through channel regions 310d and 312d to the reference voltage supply node 106 (e.g., VSS) by signal tap region 352 and node Nd2.

In some embodiments, by sharing signal tap region 350 with ESD clamp circuit 310, integrated circuit 300A has less signal taps than other approaches, resulting in current I2 flowing through less signal taps than other approaches, and to flow directly from cathode 302c and cathode 302d to signal tap region 350 of ESD clamp circuit 320 thereby reducing the signal tap resistance of integrated circuit 300A compared to other approaches.

FIG. 3B is a cross-sectional view of an integrated circuit 300B, in accordance with some embodiments.

Integrated circuit 300B is an embodiment of at least ESD clamp circuit 120 or 310, and similar detailed description is therefore omitted. Integrated circuit 300B is an embodiment of integrated circuit 300B, and similar detailed description is therefore omitted.

Integrated circuit 300B is an embodiment of at least integrated circuit 100 of FIG. 1 or integrated circuit 200 of FIG. 2, and similar detailed description is therefore omitted.

Integrated circuit 300B is a variation of integrated circuit 300A of FIG. 3A, and similar detailed description is therefore omitted. In comparison with integrated circuit 300A, current I1 replaces current I2, and similar detailed description is therefore omitted. In other words, integrated circuit 300B is configured to show ESD current flow during a PS mode of ESD stress.

During a PS mode of ESD stress or event, diode 304 is reverse biased and current I1 flows through diode 304 from the anode 304a to the cathode 304c and cathode 304d. Diode 304 is configured to transfer current I1 or ESD voltage from IO pad 108 (node Nd3) to node Nd2. Current I1 flows directly from cathode 304c and cathode 304d to signal tap region 352 of ESD clamp circuit 302. In response to current I1 and ESD voltage at node Nd2, NMOS transistors N2 and N1 in ESD clamp circuit 310 are configured to turn on, and discharge the ESD current I1 from signal tap region 352 or node Nd2 through channel regions 312d and 310d to the voltage supply node 104 (e.g., VDD) by signal tap region 350 and node Nd1.

In some embodiments, by sharing signal tap region 352 with ESD clamp circuit 310, integrated circuit 300B has less signal taps than other approaches, resulting in current I1 flowing through less signal taps than other approaches, and to flow directly from cathode 304c and cathode 304d to signal tap region 352 of ESD clamp circuit 320 thereby reducing the signal tap resistance of integrated circuit 300B compared to other approaches.

Other configurations or quantities of circuits in integrated circuit 300B are within the scope of the present disclosure.

Figure 4:
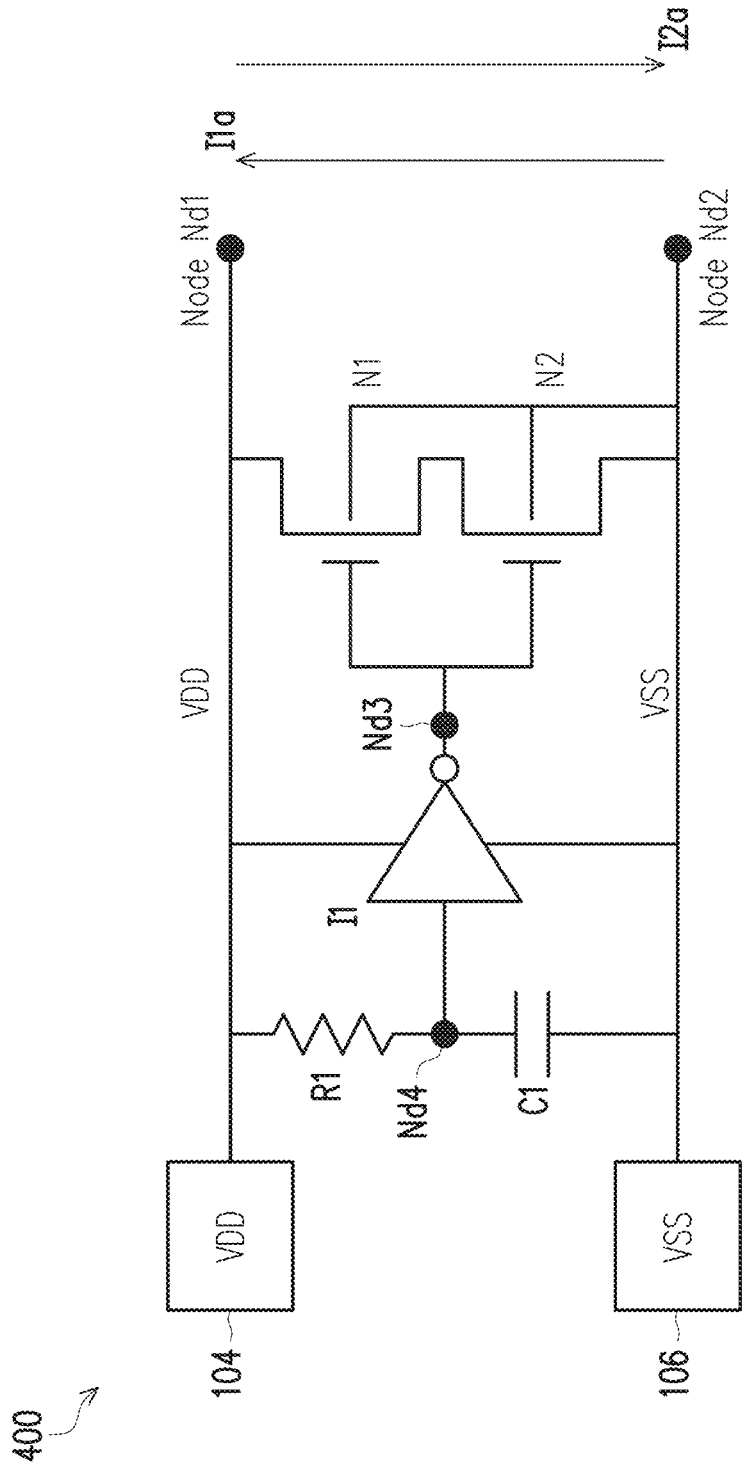

FIG. 4 is a circuit diagram of an integrated circuit 400, in accordance with some embodiments.

Integrated circuit 400 is an embodiment of at least ESD clamp circuit 120 of FIG. 1, and similar detailed description is therefore omitted. In some embodiments, integrated circuit 400 is an equivalent circuit for ESD clamp circuit 310 of FIGS. 3A-3B. In some embodiments, NMOS transistor N1 of FIG. 4 corresponds to NMOS transistor N1 of FIGS. 3A-3B, and NMOS transistor N2 of FIG. 4 corresponds to NMOS transistor N2 of FIGS. 3A-3B.

Integrated circuit 400 includes a resistor R1, a capacitor C1, an inverter I1, an NMOS transistor N1 and an NMOS transistor N2. In some embodiments, NMOS transistor N1 and NMOS transistor N2 are referred to as an ESD discharging circuit that is configured to couple node Nd1 and Nd2 during an ESD event at node Nd1 or node Nd2, thereby providing an ESD discharge path between node Nd1 and Nd2.

Each of a first end of resistor R1, node Nd1, a first voltage supply node (not labelled) of inverter I1 and a drain of NMOS transistor N1 are coupled together. Each of a second end of resistor R1, a first end of capacitor C1, an input terminal of inverter I1 and a node Nd4 are coupled together.

Each of a second end of capacitor C1, node Nd2, a source of NMOS transistor N2, a body of NMOS transistor N1, a body of NMOS transistor N2 and a second voltage supply node (not labelled) of inverter I1 are coupled together.

An output terminal of inverter I1 is coupled to a gate of NMOS transistor N1 and a gate of NMOS transistor N2.

In some embodiments, capacitor C1 is a transistor-coupled capacitor. For example in some embodiments, capacitor C1 is a transistor having a drain and source coupled together thereby forming a transistor-coupled capacitor.

Resistor R1 and capacitor C1 are configured as an RC network. Dependent upon a location of an output of the RC network, the RC network is configured as either a low pass filter or a high pass filter.

In some embodiments, inverter I1 includes an NMOS transistor (not shown) and a PMOS transistor (not shown) coupled together as an inverter circuit. Thus, a slowly rising voltage at node Nd4 will be inverted by inverter I1 thereby causing node Nd3 to rapidly rise. Furthermore, a rapidly rising voltage at node Nd4 will be inverted by inverter I1 thereby causing node Nd3 to rise slowly. In some embodiments, inverter I1 is configured to generate an inverted input signal (not shown) in response to an input signal (not shown).

When an ESD event at node Nd1 occurs (e.g., ESD current I2a in the reverse ESD direction), the ESD current or voltage at node Nd1 rises rapidly causing the voltage of node Nd4 (e.g., across capacitor C1) to rise slowly (e.g., slower than rapidly) since the voltage at node Nd4 corresponds to an output voltage of a low pass filter (e.g., a voltage across capacitor C1 with respect to node Nd2). In other words, capacitor C1 is configured as a low pass filter, and the rapidly changing voltage or current from the ESD event is filtered by capacitor C1. In response to the slowly rising voltage at node Nd4, a PMOS transistor (not shown) in inverter I1 will turn on thereby coupling node Nd3 to node Nd1 and causing node Nd3 to rapidly rise from the ESD event at node Nd1. Thus, node Nd3 and the gate of NMOS transistors N1 and N2 are charged by the ESD event at node Nd1. In response to being charged by the ESD event at node Nd3, NMOS transistors N1 and N2 turn on and couple node Nd1 to node Nd2. By being turned on and coupling node Nd1 to node Nd2, the channels of NMOS transistors N1 and N2 discharge the ESD current I2a in the reverse ESD direction from node Nd1 to Nd2.

When an ESD event at node Nd2 occurs (e.g., ESD current I1a flows in the forward ESD direction), the ESD current or voltage at node Nd2 rises rapidly, causing the voltage of node Nd4 (e.g., across capacitor C1) to rise as well. However, a rising voltage at node Nd4 will be inverted by inverter I1 thereby causing node Nd3 to not rise from the ESD event at node Nd2 causing NMOS transistors N1 and N2 to not turn on, and NMOS transistors N1 and N2 have a minimal effect on an ESD event at node Nd2.

Other configurations or quantities of circuits in integrated circuit 400 are within the scope of the present disclosure.

Figure 5:
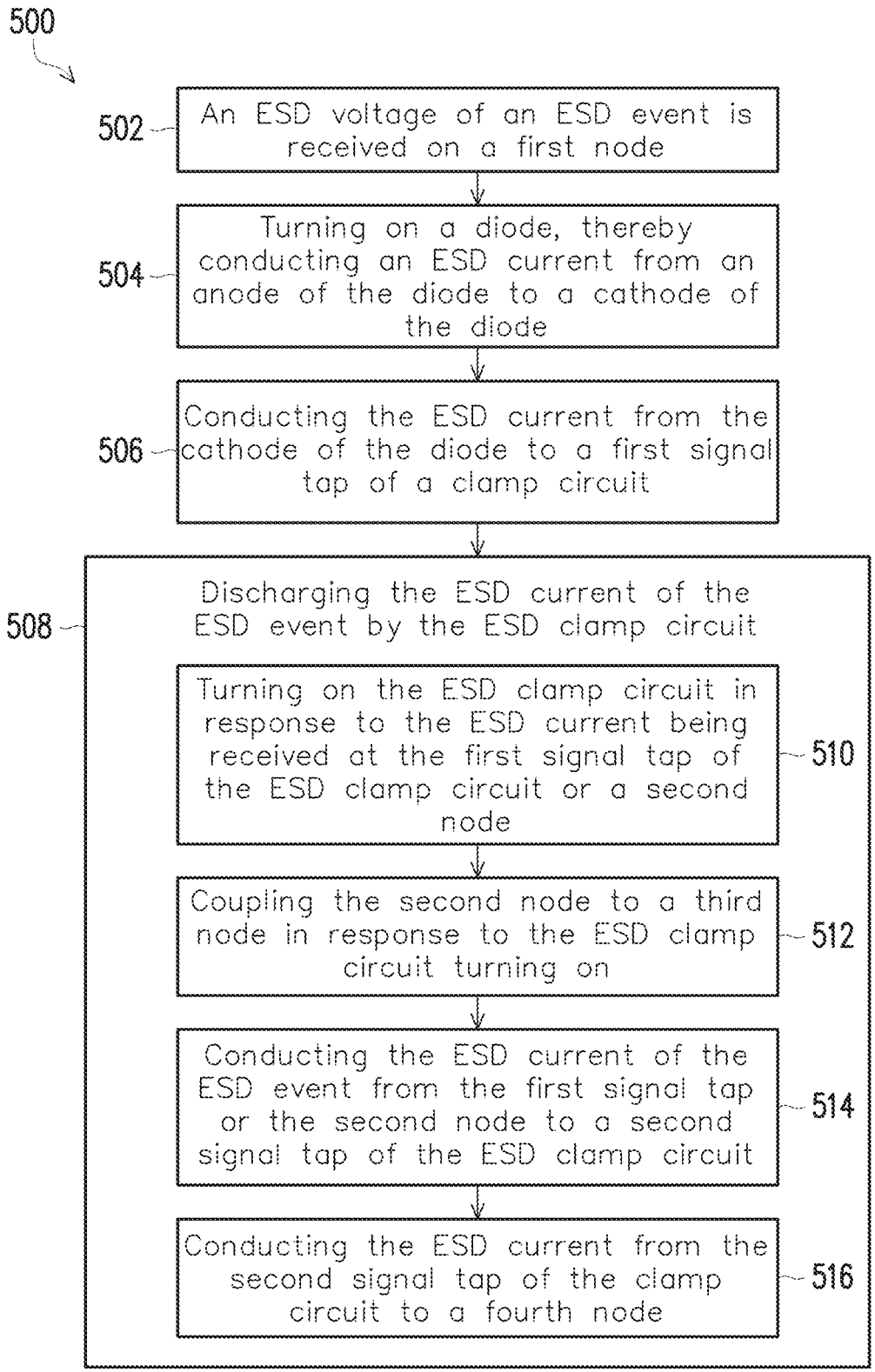

FIG. 5 is a flowchart of a method 500 of operating an ESD circuit, in accordance with some embodiments. In some embodiments, the circuit of method 500 includes at least integrated circuit 100, 200 or 300A-300B (FIG. 1, 2 or 3A-3B). It is understood that additional operations may be performed before, during, and/or after the method 500 depicted in FIG. 5, and that some other processes may only be briefly described herein. It is understood that method 500 utilizes features of one or more of integrated circuit 100, 200 or 300A-300B.

Method 500 is applicable to at least integrated circuit 300A or 300B. Method 500 is initially described with respect to integrated circuit 300A and current path I2. However, method 500 is also applicable to integrated circuit 300B and current path I1, and is described below after the description of integrated circuit 300A. Other order of operations of method 500 to integrated circuit 300A or 300B is within the scope of the present disclosure.

At operation 502 of method 500, an ESD voltage of an ESD event is received on a first node. In some embodiments, the ESD voltage is greater than a supply voltage VDD of a voltage supply. In some embodiments, the first node of method 500 includes node Nd3. In some embodiments, the first node of method 500 includes at least IO pad 108, conductive structure 340 or conductive structure 342.

At operation 504, a diode is turned on, thereby conducting an ESD current from an anode of the diode to a cathode of the diode. In some embodiments, the diode of method 500 includes at least diode D1 or 302. In some embodiments, the anode of method 500 includes at least the anode of diode D1 or anode 302a. In some embodiments, the cathode of method 500 includes at least the cathode of diode D1, cathode 302c or 302d. In some embodiments, the ESD current of method 500 includes current I2.

At operation 506, the ESD current is conducted from the cathode of the diode to a first signal tap of a clamp circuit. In some embodiments, the first signal tap of method 500 includes at least signal tap 250 or 350. In some embodiments, the clamp circuit of method 500 includes at least ESD clamp circuit 120, 220, or 310.

At operation 508, the ESD current of the ESD event is discharged by the ESD clamp circuit. In some embodiments, the ESD current of the ESD event is discharged by a channel of a first transistor or a channel of a second transistor. In some embodiments, the first transistor of method 500 includes NMOS transistor N1, and the channel includes channel region 310d. In some embodiments, the second transistor of method 500 includes NMOS transistor N2, and the channel includes channel region 312d.

In some embodiments, operation 508 includes at least operation 510, 512, 514 or 516.

At operation 510, the ESD clamp circuit is turned on in response to the ESD current being received at the first signal tap of the ESD clamp circuit or a second node. In some embodiments, the second node of method 500 includes node Nd1. In some embodiments, the second node of method 500 corresponds to conductive structure 390.

At operation 512, the second node is coupled to a third node in response to the ESD clamp circuit turning on. In some embodiments, the third node of method 500 includes node Nd2. In some embodiments, the third node of method 500 corresponds to conductive structure 392. In some embodiments, the second node is coupled to the third node in response to the NMOS transistor N1 and NMOS transistor N2 of ESD clamp circuit turning on.

At operation 514, the ESD current is conducted from the first signal tap or the second node to a second signal tap of the ESD clamp circuit. In some embodiments, the second signal tap of method 500 includes at least signal tap 252 or 352.

At operation 516, the ESD current is conducted from the second signal tap of the clamp circuit to a fourth node. In some embodiments, the fourth node of method 500 includes at least reference voltage supply node 106 (e.g., voltage VSS) or conductive structure 346.

While method 500 was described with respect to integrated circuit 300A and current path I2, method 500 is also applicable to integrated circuit 300B and current path I1 and is described below with similar operations.

For example, at operation 502, the ESD voltage of the ESD event is received on the first node. In some embodiments, the ESD voltage is greater than a reference supply voltage VSS of reference voltage supply node 106. In some embodiments, the first node of method 500 includes at least IO pad 108 or conductive structure 342.

At operation 504, the diode is turned on, thereby conducting the ESD current from the anode of the diode to the cathode of the diode. In some embodiments, the diode of method 500 includes at least diode D2 or 304. In some embodiments, the anode of method 500 includes at least the anode of diode D2 or anode 304a. In some embodiments, the cathode of method 500 includes at least the cathode of diode D2, cathode 304c or 304d. In some embodiments, the ESD current of method 500 includes current I1.

At operation 506, the ESD current is conducted from the cathode of the diode to the first signal tap of the clamp circuit. In some embodiments, the first signal tap of method 500 includes at least signal tap 252 or 352.

At operation 508, the ESD current of the ESD event is discharged by the ESD clamp circuit. In some embodiments, the SD current of the ESD event is discharged by channel region 312d of NMOS transistor N2 and channel region 310d of NMOS transistor N1.

At operation 510, the ESD clamp circuit is turned on in response to the ESD current being received at the first signal tap of the ESD clamp circuit or the second node. In some embodiments, the second node of method 500 includes node Nd2. In some embodiments, the second node of method 500 corresponds to conductive structure 392.

At operation 512, the second node is coupled to the third node in response to the ESD clamp circuit turning on. In some embodiments, the third node of method 500 includes node Nd1. In some embodiments, the third node of method 500 corresponds to conductive structure 390. In some embodiments, the second node is coupled to the third node in response to the NMOS transistor N1 and NMOS transistor N2 of ESD clamp circuit turning on.

At operation 514, the ESD current is conducted from the first signal tap or the second node to the second signal tap of the ESD clamp circuit. In some embodiments, the second signal tap of method 500 includes at least signal tap 250 or 350.

At operation 516, the ESD current is conducted from the second signal tap of the clamp circuit to the fourth node. In some embodiments, the fourth node of method 500 includes at least voltage supply node 104 (e.g., voltage VDD) or conductive structure 344.

In some embodiments, one or more of the operations of method 500 is not performed. In some embodiments, one or more of the operations of method 500 is repeated. In some embodiments, method 500 is repeated.

Figure 6:
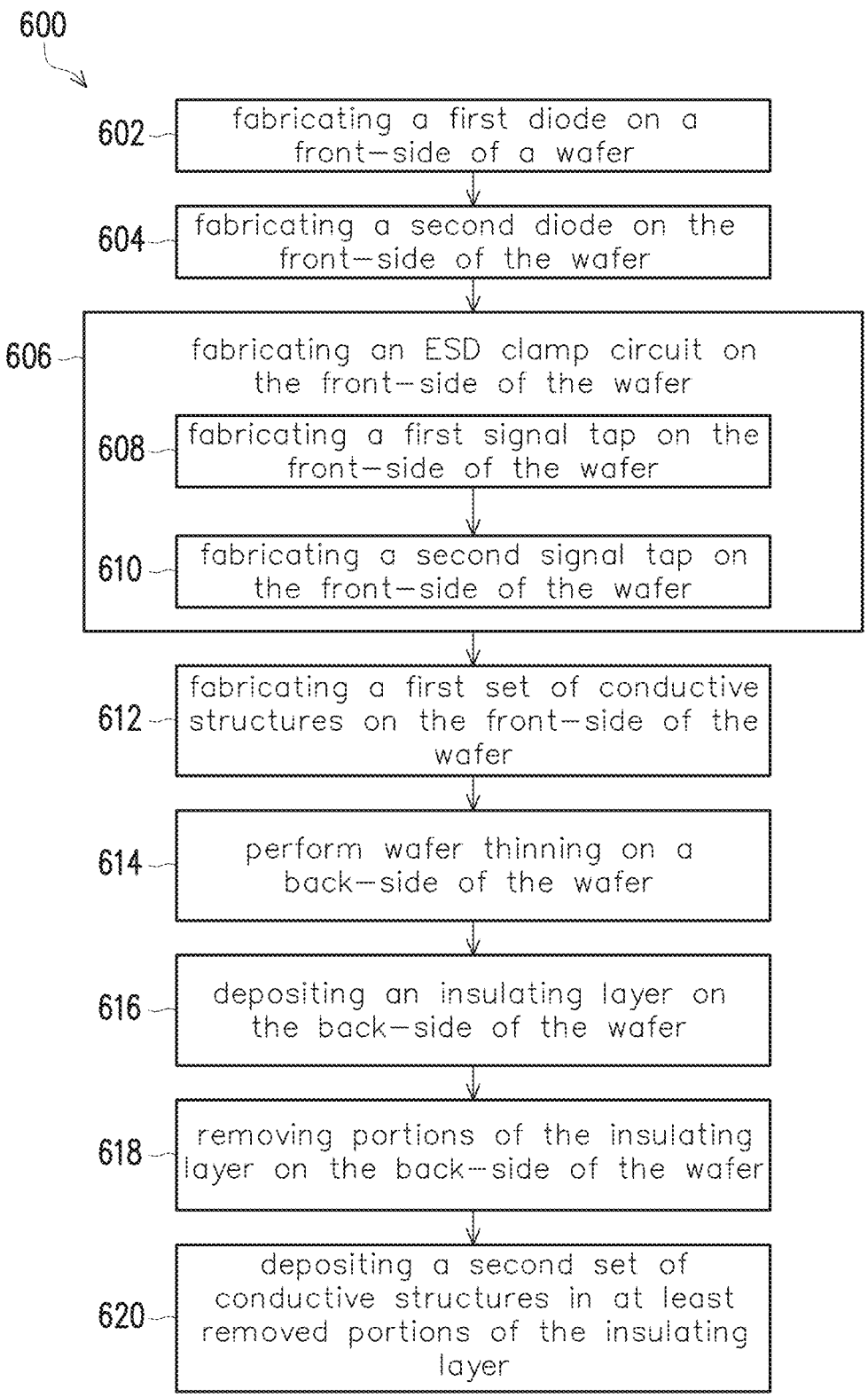

FIG. 6 is a flow chart of a method of manufacturing an integrated circuit, in accordance with some embodiments. In some embodiments, the method 600 is usable to manufacture or fabricate at least integrated circuit 100, 200 or 300A-300B (FIG. 1, 2 or 3A-3B). It is understood that additional operations may be performed before, during, and/or after the method 600 depicted in FIG. 6, and that some other processes may only be briefly described herein. It is understood that method 600 utilizes features of one or more of integrated circuit 100, 200 or 300A-300B.

Method 600 is applicable to at least integrated circuit 300A or 300B. Method 600 is described with respect to integrated circuit 300A. However, method 600 is also applicable to integrated circuit 300B. Other order of operations of method 600 to integrated circuit 300A or 300B is within the scope of the present disclosure.

In operation 602 of method 600, a first diode is fabricated on a front-side of a wafer. In some embodiments, the wafer of method 600 includes substrate 320. In some embodiments, the front-side of the wafer of method 600 includes at least front-side 305 of substrate 320. In some embodiments, the first diode of method 600 includes at least diode 302.

Figure 7A:
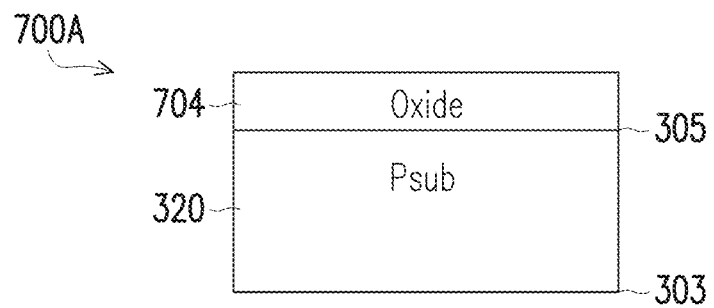

In some embodiments, operation 602 includes at least operation 602a or 602b. In some embodiments, operation 602a includes depositing an oxide layer 704 (FIGS. 7A-7E) on the front-side 305 of substrate 320 and is shown in FIG. 7A.

Figure 7B:
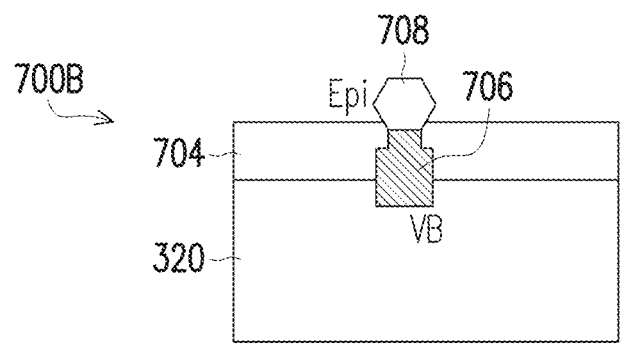

In some embodiments, operation 602b includes forming an opening in the oxide layer 704, and then filling the opening in the oxide layer with a conductive material thereby forming a via 706 (FIG. 7B), and growing an epitaxial layer 708 (FIG. 7B) in an unfilled portion of the opening and is shown in FIG. 7B. In some embodiments, the epitaxial layer 708 (FIG. 7B) corresponds to cathode region 302c and 302d.

In some embodiments, operation 602 further includes fabricating well 322 in substrate 320, fabricating a heavily doped region 324 in well 322 thereby forming anode region 302a of the first diode, fabricating cathode region 302c and 302d in well 322, and fabricating gate structure 302b.

In some embodiments, at least well 322, well 360 or 362 (e.g., ESD clamp circuit 310) comprises p-type dopants. In some embodiments, the p-dopants include boron, aluminum or other suitable p-type dopants. In some embodiments, at least well 322, well 360 or 362 comprises an epi-layer grown over substrate 320. In some embodiments, the epi-layer is doped by adding dopants during the epitaxial process. In some embodiments, the epi-layer is doped by ion implantation after the epi-layer is formed. In some embodiments, at least well 322, well 360 or 362 is formed by doping substrate 320. In some embodiments, the doping is performed by ion implantation. In some embodiments, at least well 322, well 360 or 362 has a dopant concentration ranging from $1 \times 10^{12}$ atoms/cm$^3$ to $1 \times 10^{14}$ atoms/cm$^3$. In some embodiments, region 324 is formed by a process similar to the formation of well 322. In some embodiments, region 324 is a heavily doped p-region.

In some embodiments, at least fabricating cathode regions 302c and 302d of operation 602 or fabricating cathode regions 304c and 304d of operation 604 (described below) includes the formation of cathode features in the substrate. In some embodiments, the formation of the cathode features includes removing a portion of the substrate to form recesses at an edge of well 322 or 332, and a filling process is then performed by filling the recesses in the substrate. In some embodiments, the recesses are etched, for example, by a wet etching or a dry etching, after removal of a pad oxide layer or a sacrificial oxide layer. In some embodiments, the etch process is performed to remove a top surface portion of the active region adjacent to an isolation region, such as STI region 328a, 328b, 328c or 328d. In some embodiments, the filling process is performed by an epitaxy or epitaxial (epi) process. In some embodiments, the recesses are filled using a growth process which is concurrent with an etch process where a growth rate of the growth process is greater than an etch rate of the etch process. In some embodiments, the recesses are filled using a combination of growth process and etch process. For example, a layer of material is grown in the recess and then the grown material is subjected to an etch process to remove a portion of the material. Then a subsequent growth process is performed on the etched material until a desired thickness of the material in the recess is achieved. In some embodiments, the growth process continues until a top surface of the material is above the top surface of the substrate. In some embodiments, the growth process is continued until the top surface of the material is co-planar with the top surface of the substrate. In some embodiments, a portion of well 322 or 332 is removed by an isotropic or an anisotropic etch process. The etch process selectively etches well 322 or 332 without etching gate structure 302b or 304b. In some embodiments, the etch process is performed using a reactive ion etch (RIE), wet etching, or other suitable techniques. In some embodiments, a semiconductor material is deposited in the recesses to form the cathode features similar to source/drain features. In some embodiments, an epi process is performed to deposit the semiconductor material in the recesses. In some embodiments, the epi process includes a selective epitaxy growth (SEG) process, CVD process, molecular beam epitaxy (MBE), other suitable processes, and/or combination thereof. The epi process uses gaseous and/or liquid precursors, which interacts with a composition of substrate 320. In some embodiments, the cathode features include epitaxially grown silicon (epi Si), silicon carbide, or silicon germanium. Cathode features of the IC device associated with gate structure 302b or 304b are in-situ doped or undoped during the epi process in some instances. When cathode features are undoped during the epi process, cathode features are doped during a subsequent process in some instances. The subsequent doping process is achieved by an ion implantation, plasma immersion ion implantation, gas and/or solid source diffusion, other suitable processes, and/or combination thereof. In some embodiments, cathode features are further exposed to annealing processes after forming cathode features and/or after the subsequent doping process.

In some embodiments, at least fabricating the gate regions of operation 602, 604 or 606 (described below) includes performing one or more deposition processes to form one or more dielectric material layers. In some embodiments, a deposition process includes a chemical vapor deposition (CVD), a plasma enhanced CVD (PECVD), an atomic layer deposition (ALD), or other process suitable for depositing one or more material layers. In some embodiments, fabricating the gate regions includes performing one or more deposition processes to form one or more conductive material layers. In some embodiments, fabricating the gate regions includes forming gate electrodes or dummy gate electrodes. In some embodiments, fabricating the gate regions includes depositing or growing at least one dielectric layer, e.g., gate dielectric. In some embodiments, gate regions are formed using a doped or non-doped polycrystalline silicon (or polysilicon). In some embodiments, the gate regions include a metal, such as Al, Cu, W, Ti, Ta, TiN, TaN, NiSi, CoSi, other suitable conductive materials, or combinations thereof.

In operation 604 of method 600, a second diode is fabricated on the front-side of the wafer. In some embodiments, the back-side of the wafer of method 600 includes at least back-side 303 of substrate 320. In some embodiments, the second diode of method 600 includes at least diode 304.

In some embodiments, operation 604 includes at least operation 604a or 604b. In some embodiments, operation 604a includes depositing oxide layer 704 (FIGS. 7A-7E) on the front-side 305 of substrate 320 and is shown in FIG. 7A.

In some embodiments, operation 604b includes forming an opening in the oxide layer 704, and then filling the opening in the oxide layer with a conductive material thereby forming a via 706 (FIG. 7B), and growing an epitaxial layer 708 (FIG. 7B) is grown in an unfilled portion of the opening and is shown in FIG. 7B. In some embodiments, the epitaxial layer 708 (FIG. 7B) corresponds to cathode region 304c and 304d.

In some embodiments, operation 604 further includes fabricating well 332 in substrate 320, fabricating a heavily doped region 334 in well 332 thereby forming anode region 304a of the second diode, fabricating cathode region 304c and 304d above well 332, and fabricating gate structure 304b.

In some embodiments, well 332 comprises n-type dopants. In some embodiments, the n-type dopants include phosphorus, arsenic or other suitable n-type dopants. In some embodiments, the n-type dopant concentration ranges from about $1\times10^{12}$ atoms/cm$^3$ to about $1\times10^{14}$ atoms/cm$^3$. In some embodiments, well 332 is formed by ion implantation. The power of the ion implantation ranges from about 1500 k electron volts (eV) to about 8000 k eV. In some embodiments, well 332 is epitaxially grown. In some embodiments, well 332 comprises an epi-layer grown over the surface. In some embodiments, the epi-layer is doped by adding dopants during the epitaxial process. In some embodiments, the epi-layer is doped by ion implantation after the epi-layer is formed, and has the dopant concentration described above. In some embodiments, region 334 is formed by a process similar to the formation of well 332. In some embodiments, region 334 is a heavily doped n-region.

In operation 606 of method 600, an ESD clamp circuit is fabricated on the front-side of the wafer. In some embodiments, the ESD clamp circuit of method 600 includes at least ESD clamp circuit 310.

In some embodiments, operation 606 includes at least operation 606a or 606b. In some embodiments, operation 606a includes depositing oxide layer 704 (FIGS. 7A-7E) on the front-side 305 of substrate 320 and is shown in FIG. 7A.

In some embodiments, operation 606b includes forming an opening in the oxide layer 704, and then filling the opening in the oxide layer with a conductive material thereby forming a via 706 (FIG. 7B), and growing an epitaxial layer 708 (FIG. 7B) in an unfilled portion of the opening and is shown in FIG. 7B. In some embodiments, the epitaxial layer 708 (FIG. 7B) corresponds to source 310c or 312c and drain 310a or 312a.

In some embodiments, operation 606 further includes fabricating wells 360 and 362 in substrate 320, fabricating source/drain regions (e.g., source 310c and drain 310a) in well 360, and fabricating source/drain regions (e.g., source 312c and drain 312a) in well 362, and fabricating gate structures 310b and 312b.

In some embodiments, fabricating source/drain regions (e.g., source 310c and drain 310a) in well 360 of operation 606 includes operation 608. In some embodiments, fabricating source/drain regions (e.g., source 312c and drain 312a) in well 362 of operation 606, and fabricating gate structures 310b and 312b includes operation 610.

In operation 608 of method 600, a first signal tap region is fabricated on the front-side of the wafer. In some embodiments, the first signal tap region of method 600 includes at least signal tap region 350. In some embodiments, signal tap region 350 corresponds to drain 310a of ESD clamp circuit 310. In some embodiments, operation 608 corresponds to operation 606b.

In operation 610 of method 600, a second signal tap is fabricated on the front-side of the wafer. In some embodiments, the second signal tap region of method 600 includes at least signal tap region 352. In some embodiments, signal tap region 352 corresponds to source 312c of ESD clamp circuit 310. In some embodiments, operation 608 corresponds to operation 606b.

In some embodiments, at least signal tap region 350 or 352 comprises p-type dopants. In some embodiments, the p-dopants include boron, aluminum or other suitable p-type dopants. In some embodiments, at least signal tap region 350 or 352 is formed by a process similar to the formation of corresponding well 360 or 362. In some embodiments, at least signal tap region 350 or 352 is a heavily doped p-region.

In some embodiments, at least signal tap region 350 or 352 comprises n-type dopants. In some embodiments, the n-type dopants include phosphorus, arsenic or other suitable n-type dopants. In some embodiments, the n-type dopant concentration ranges from about $1\times10^{12}$ atoms/cm2 to about $1\times10^{14}$ atoms/cm2. In some embodiments, at least signal tap region 350 or 352 is formed by ion implantation. The power of the ion implantation ranges from about 1500 k electron volts (eV) to about 8000 k eV. In some embodiments, at least signal tap region 350 or 352 is a heavily doped n-region.

In some embodiments, at least signal tap region 350 or 352 is epitaxially grown. In some embodiments, at least signal tap region 350 or 352 comprises an epi-layer grown over substrate 320. In some embodiments, the epi-layer is doped by adding dopants during the epitaxial process. In some embodiments, the epi-layer is doped by ion implantation after the epi-layer is formed. In some embodiments, at least signal tap region 350 or 352 is formed by doping substrate 320. In some embodiments, the doping is performed by ion implantation. In some embodiments, at least signal tap region 350 or 352 has a dopant concentration ranging from $1\times10^{12}$ atoms/cm3 to $1\times10^{14}$ atoms/cm3.

Figure 7C:
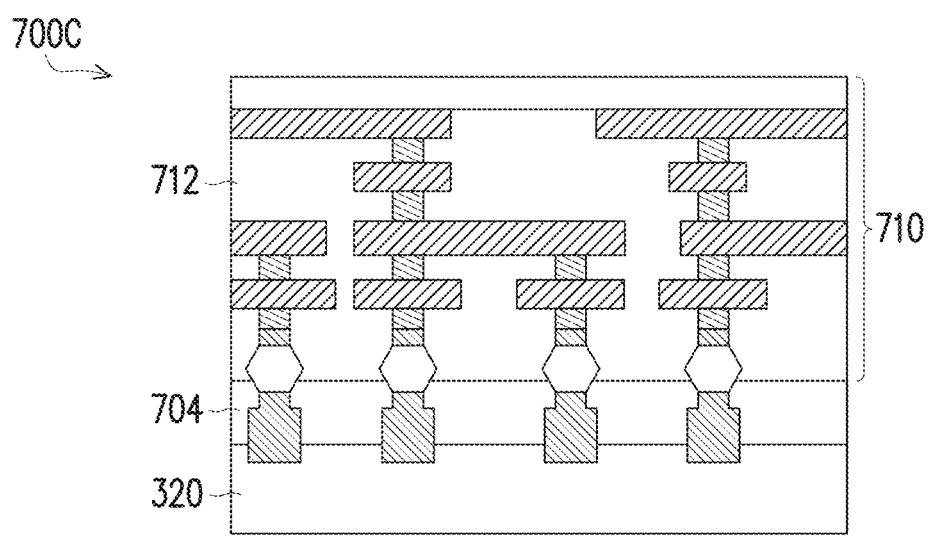

In operation 612 of method 600, a first set of conductive structures 710 (FIG. 7C) is fabricated on the front-side 305 of the wafer 320. FIG. 7C is a cross-sectional view of the first set of conductive structures 710 fabricated on the front-side 305 of the wafer 320 following at least operation 612, in accordance with one or more embodiments.

In some embodiments, operation 612 includes depositing the first set of conductive structures 710 on the front-side 305 of the wafer 320. In some embodiments, the first set of conductive structures 710 of method 600 includes at least conductive structure 390 and conductive structure 392.

In some embodiments, operation 612 includes depositing an insulating layer 712 (FIG. 7C) on the front-side 305 of the wafer 320, removing portions of the insulating layer 712 from the front-side 305 of the wafer 320, and depositing the first set of conductive structures 710 in the removed portions of the insulating layer 712 on the front-side 305 of the wafer 320. In some embodiments, the first set of conductive structures of method 600 are formed using a combination of photolithography and material removal processes to form openings in an insulating layer (not shown) over the substrate. In some embodiments, the photolithography process includes patterning a photoresist, such as a positive photoresist or a negative photoresist. In some embodiments, the photolithography process includes forming a hard mask, an antireflective structure, or another suitable photolithography structure. In some embodiments, the material removal process includes a wet etching process, a dry etching process, an RIE process, laser drilling or another suitable etching process. The openings are then filled with conductive material, e.g., copper, aluminum, titanium, nickel, tungsten, or other suitable conductive material. In some embodiments, the openings are filled using CVD, PVD, sputtering, ALD or other suitable formation process.

Figure 7D:
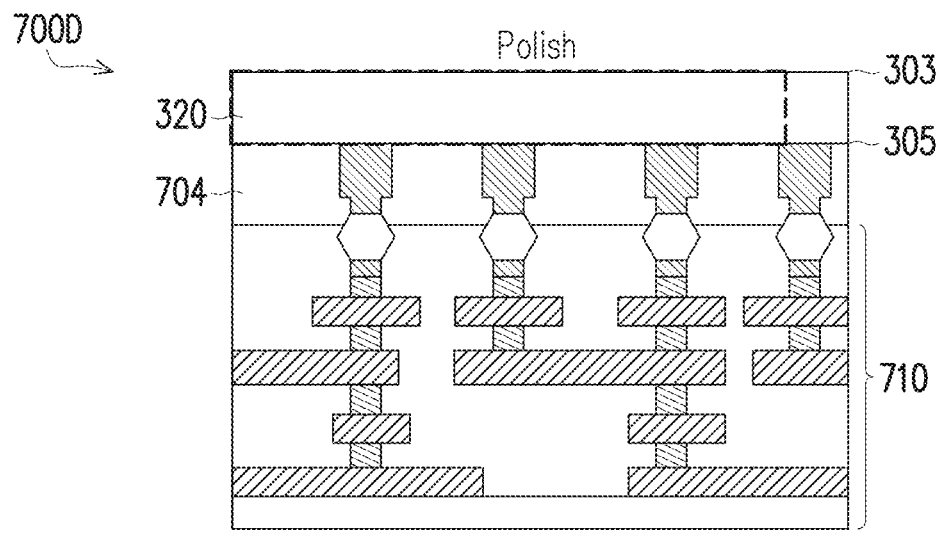

In operation 614 of method 600, wafer thinning is performed on the back-side 303 of the wafer. FIG. 7D is a cross-sectional view of the wafer 320 prior to the wafer thinning of operation 614, in accordance with one or more embodiments.

In some embodiments, operation 614 includes flipping the wafer 320 over, and performing a thinning process on the back-side 303 of the semiconductor wafer or substrate. In some embodiments, the thinning process includes a grinding operation and a polishing operation (such as chemical mechanical polishing (CMP)) or other suitable processes. In some embodiments, after the thinning process, a wet etching operation is performed to remove defects formed on the backside 303 of the semiconductor wafer 320 or substrate.

In operation 616 of method 600, an insulating layer 722 (FIG. 7E) is deposited on the back-side of the wafer. In some embodiments, the insulating layer 722 of method 600 includes insulating layer 321. In some embodiments, the insulating layer 321 includes a dielectric material including oxide or another suitable insulating material. In some embodiments, the insulating layer 321 is formed by CVD, spin-on polymeric dielectric, atomic layer deposition (ALD), or other processes.

In operation 618 of method 600, portions of the insulating layer 722 are removed from the back-side of the wafer. In some embodiments, operation 618 of method 600 uses a combination of photolithography and material removal processes to form openings in an insulating layer 722 over the wafer 320. In some embodiments, the photolithography process includes patterning a photoresist, such as a positive photoresist or a negative photoresist. In some embodiments, the photolithography process includes forming a hard mask, an antireflective structure, or another suitable photolithography structure. In some embodiments, the material removal process includes a wet etching process, a dry etching process, an RIE process, laser drilling or another suitable etching process.

Figure 7E:
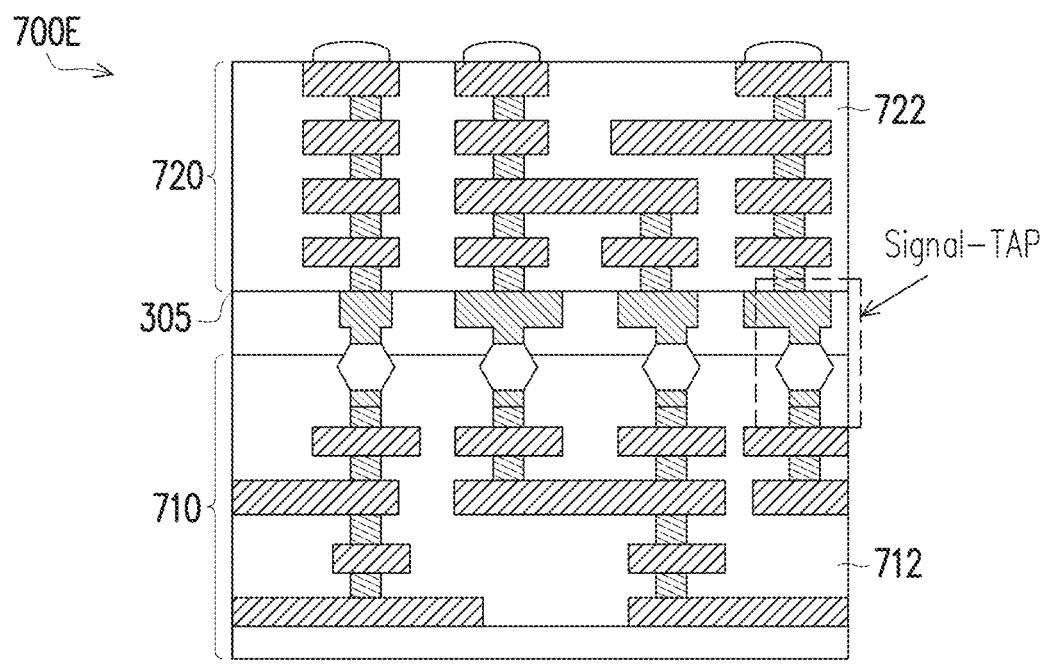

In operation 620 of method 600, a second set of conductive structures 720 (FIG. 7E) is deposited in at least the removed portion of the insulating layer. FIG. 7E is a cross-sectional view of the wafer 320 following at least operation 620, in accordance with one or more embodiments.

In some embodiments, operation 620 includes depositing the second set of conductive structures 720 on the back-side of the wafer. In some embodiments, the second set of conductive structures 720 of method 600 includes at least conductive structure 340, conductive structure 342, conductive structure 344 or conductive structure 346.

In some embodiments, operation 620 includes filling the openings in the insulating layer 722 with conductive material, e.g., copper, aluminum, titanium, nickel, tungsten, or other suitable conductive material. In some embodiments, the openings are filled using CVD, PVD, sputtering, ALD or other suitable formation process.

In some embodiments, one or more of the operations of method 600 is not performed. In some embodiments, one or more of the operations of method 600 is repeated. In some embodiments, method 600 is repeated.

FIGS. 7A-7E are cross-sectional views of an integrated circuit, in accordance with one or more embodiments.

FIG. 7A is a cross-sectional view of an integrated circuit 700A, in accordance with one or more embodiments. In some embodiments, integrated circuit 700A corresponds to an integrated circuit, such as integrated circuit 300A or 300B, following at least operation 602a, 604a or 606a. In some embodiments, integrated circuit 700A includes an oxide layer 704 on substrate 320.

FIG. 7B is a cross-sectional view of an integrated circuit 700B, in accordance with one or more embodiments. In some embodiments, integrated circuit 700B corresponds to an integrated circuit, such as integrated circuit 300A or 300B, following at least operation 602b, 604b or 606b. In some embodiments, integrated circuit 700B includes via 706 formed in an opening of at least the oxide layer 704 or the substrate 320. In some embodiments, integrated circuit 700B further includes an epitaxial layer 708 over via 706, the oxide layer 704 and the substrate 320. In some embodiments, the epitaxial layer 708 is grown in an unfilled portion of the opening of the oxide layer 704.

FIG. 7C is a cross-sectional view of an integrated circuit 700C, in accordance with one or more embodiments. In some embodiments, integrated circuit 700C corresponds to an integrated circuit, such as integrated circuit 300A or 300B, following at least operation 612. In some embodiments, integrated circuit 700C includes the first set of conductive structures 710, insulating layer 712 and integrated circuit 700B. In some embodiments, integrated circuit 700C includes the first set of conductive structures 710 fabricated in removed portions of insulating layer 712 on the front-side 305 of the wafer 320.

FIG. 7D is a cross-sectional view of an integrated circuit 700D, in accordance with one or more embodiments. In some embodiments, integrated circuit 700D corresponds to an integrated circuit, such as integrated circuit 300A or 300B, prior to the wafer thinning of operation 614. In some embodiments, integrated circuit 700D includes integrated circuit 700C flipped over.

FIG. 7E is a cross-sectional view of an integrated circuit 700E, in accordance with one or more embodiments. In some embodiments, integrated circuit 700E corresponds to an integrated circuit, such as integrated circuit 300A or 300B, following at least operation 620. In some embodiments, integrated circuit 700E includes the second set of conductive structures 720, insulating layer 722 and integrated circuit 700D (without the removed portion of wafer 320). In some embodiments, integrated circuit 700E includes the second set of conductive structures 720 fabricated in removed portions of insulating layer 722 of the wafer 320.

Other diode types or numbers of diodes, or other transistor types or other numbers of transistors in at least integrated circuit 100, 200 and 300A-300B of corresponding FIGS. 1, 2 and 3A-3B are within the scope of the present disclosure.

Furthermore, various NMOS or PMOS transistors shown in FIGS. 3A-3B are of a particular dopant type (e.g., N-type or P-type) and are for illustration purposes. Embodiments of the disclosure are not limited to a particular transistor type, and one or more of the PMOS or NMOS transistors shown in FIGS. 3A-3B can be substituted with a corresponding transistor of a different transistor/dopant type. Similarly, the low or high logical value of various signals used in the above description is also used for illustration. Embodiments of the disclosure are not limited to a particular logical value when a signal is activated and/or deactivated. Selecting different logical values is within the scope of various embodiments. Selecting different numbers of PMOS transistors in 3A-3B is within the scope of various embodiments.

One aspect of this description relates to an ESD protection circuit. The ESD protection circuit includes a first diode, a second diode and an ESD clamp circuit. The first diode is in a semiconductor wafer, and is coupled to an IO pad. The second diode is in the semiconductor wafer, and is coupled to the first diode and the IO pad. The ESD clamp circuit is in the semiconductor wafer, and is coupled to the first diode and the second diode. The ESD clamp circuit includes a first signal tap region in the semiconductor wafer. The first signal tap region is coupled to a first voltage supply. The first diode is coupled to and configured to share the first signal tap region with the ESD clamp circuit.

Another aspect of this description relates to an ESD protection circuit. The ESD protection circuit includes a first diode, a second diode, an internal circuit and an ESD clamp circuit. The first diode is in a semiconductor wafer, and is coupled to a first pad. The second diode is in the semiconductor wafer, and is coupled to the first diode and the first pad. The internal circuit is coupled to the first diode and the second diode The ESD clamp circuit is in the semiconductor wafer, is coupled to the first diode by a first node and is coupled to the second diode by a second node. The ESD clamp circuit includes a first signal tap region coupled to a voltage supply, and a second signal tap region coupled to a reference voltage supply. The first diode is coupled to and configured to share the first signal tap region with the ESD clamp circuit. The second diode is coupled to and configured to share the second signal tap region with the ESD clamp circuit.

Yet another aspect of this description relates to a method of operating an ESD protection circuit. The method includes receiving a first ESD voltage on a first node, the first ESD voltage being greater than a supply voltage of a voltage supply, the first ESD voltage corresponding to a first ESD event. The method further includes turning on a first diode, thereby conducting a first ESD current from a first anode of the first diode to a first cathode of the first diode. The method further includes conducting the first ESD current from the first cathode of the first diode to a first signal tap of an ESD clamp circuit. The method further includes discharging the first ESD current of the first ESD event by the ESD clamp circuit.

A number of embodiments have been described. It will nevertheless be understood that various modifications may be made without departing from the spirit and scope of the disclosure. For example, various transistors being shown as a particular dopant type (e.g., N-type or P-type Metal Oxide Semiconductor (NMOS or PMOS)) are for illustration purposes. Embodiments of the disclosure are not limited to a particular type. Selecting different dopant types for a particular transistor is within the scope of various embodiments. The low or high logical value of various signals used in the above description is also for illustration. Various embodiments are not limited to a particular logical value when a signal is activated and/or deactivated. Selecting different logical values is within the scope of various embodiments. In various embodiments, a transistor functions as a switch. A switching circuit used in place of a transistor is within the scope of various embodiments. In various embodiments, a source of a transistor can be configured as a drain, and a drain can be configured as a source. As such, the term source and drain are used interchangeably. Various signals are generated by corresponding circuits, but, for simplicity, the circuits are not shown.

Various figures show capacitive circuits using discrete capacitors for illustration. Equivalent circuitry may be used. For example, a capacitive device, circuitry or network (e.g., a combination of capacitors, capacitive elements, devices, circuitry, or the like) can be used in place of the discrete capacitor. The above illustrations include exemplary steps, but the steps are not necessarily performed in the order shown. Steps may be added, replaced, changed order, and/or eliminated as appropriate, in accordance with the spirit and scope of disclosed embodiments.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An electrostatic discharge (ESD) protection circuit, comprising:
a first diode in a semiconductor wafer, and being coupled to an input output (IO) pad;
a second diode in the semiconductor wafer, and being coupled to the first diode and the IO pad; and
an ESD clamp circuit in the semiconductor wafer, coupled to the first diode and the second diode, the ESD clamp circuit including a first signal tap region in the semiconductor wafer, the first signal tap region being coupled to a first voltage supply, the first diode being coupled to and configured to share the first signal tap region with the ESD clamp circuit.

2. The ESD protection circuit of claim 1, wherein the ESD clamp circuit further includes a second signal tap region in the semiconductor wafer, the second signal tap region being coupled to a second voltage supply different from the first voltage supply, the second diode being coupled to and configured to share the second signal tap region with the ESD clamp circuit.

3. The ESD protection circuit of claim 2, further comprising:
a first conductive structure coupled between the first voltage supply and the first signal tap region; and
a second conductive structure coupled between the second voltage supply and the second signal tap region, the first conductive structure and the second conductive structure are located on a backside of the semiconductor wafer.

4. The ESD protection circuit of claim 3, wherein
the first conductive structure is configured to provide a first voltage of the first voltage supply to the first signal tap region; and
the second conductive structure is configured to provide a second voltage of the second voltage supply to the second signal tap region.

5. The ESD protection circuit of claim 1, further comprising:
an IO circuit in the semiconductor wafer, being coupled to the first diode, the second diode, and the IO pad.

6. The ESD protection circuit of claim 1, wherein the IO pad comprises:
a first conductive structure coupled to a first anode of the first diode; and
a second conductive structure coupled to a second anode of the second diode, the first conductive structure and the second conductive structure are located on a backside of the semiconductor wafer.

7. The ESD protection circuit of claim 1, wherein at least the first diode or the second diode does not have a signal tap region.

8. The ESD protection circuit of claim 1, wherein
the first diode is a first nanosheet vertical well diode;
the second diode is a second nanosheet vertical well diode; and
the ESD clamp circuit is at least one nanosheet transistor device.

9. An electrostatic discharge (ESD) protection circuit, comprising:
a first diode in a semiconductor wafer, and being coupled to a first pad;
a second diode in the semiconductor wafer, and being coupled to the first diode and the first pad;
an internal circuit coupled to the first diode and the second diode; and
an ESD clamp circuit in the semiconductor wafer, coupled to the first diode by a first node and coupled to the second diode by a second node, the ESD clamp circuit including a first signal tap region coupled to a voltage supply, and a second signal tap region coupled to a reference voltage supply,
wherein the first diode is coupled to and configured to share the first signal tap region with the ESD clamp circuit; and
the second diode is coupled to and configured to share the second signal tap region with the ESD clamp circuit.

10. The ESD protection circuit of claim 9, wherein the first diode comprises:
a first anode in the semiconductor wafer; and
a first cathode in the semiconductor wafer, being above the first anode and being coupled to the first signal tap region by the first node.

11. The ESD protection circuit of claim 10, wherein the first diode further comprises:
a second cathode in the semiconductor wafer, being above the first anode and being coupled to the first signal tap region and the first cathode by the first node.

12. The ESD protection circuit of claim 11, wherein the second diode comprises:
a second anode in the semiconductor wafer; and
a third cathode in the semiconductor wafer, being above the second anode and being coupled to the second signal tap region by the second node.

13. The ESD protection circuit of claim 12, wherein the second diode further comprises:
a fourth cathode in the semiconductor wafer, being above the second anode and being coupled to the second signal tap region and the third cathode by the second node.

14. The ESD protection circuit of claim 13, further comprising:
a first conductive structure coupled between the voltage supply and the first signal tap region; and
a second conductive structure coupled between the reference voltage supply and the second signal tap region, the first conductive structure and the second conductive structure are located on a backside of the semiconductor wafer.

15. The ESD protection circuit of claim 14, wherein the first pad comprises:
a third conductive structure coupled to the first anode of the first diode;
a fourth conductive structure coupled to the second anode of the second diode, the third conductive structure and the fourth conductive structure are located on the backside of the semiconductor wafer.

16. The ESD protection circuit of claim 9, wherein the ESD clamp circuit is coupled between the first diode and the second diode.

17. A method of operating an electrostatic discharge (ESD) protection circuit, the method comprising:

receiving a first ESD voltage on a first node, the first ESD voltage being greater than a supply voltage of a voltage supply, the first ESD voltage corresponding to a first ESD event;

turning on a first diode, thereby conducting a first ESD current from a first anode of the first diode to a first cathode of the first diode;

conducting the first ESD current from the first cathode of the first diode to a first signal tap of an ESD clamp circuit, wherein the ESD clamp circuit is coupled to the first diode, the first signal tap is coupled to the voltage supply, and the first diode is coupled to and configured to share the first signal tap with the ESD clamp circuit; and discharging the first ESD current of the first ESD event by the ESD clamp circuit.

18. The method of claim 17, wherein discharging the first ESD current of the first ESD event by the ESD clamp circuit comprises:

turning on the ESD clamp circuit in response to the first ESD current being received at the first signal tap of the ESD clamp circuit or a second node;

coupling the second node to a third node in response to the ESD clamp circuit turning on;

conducting the first ESD current from the first signal tap to a second signal tap of the ESD clamp circuit; and conducting the first ESD current from the second signal tap of the ESD clamp circuit to a fourth node.

19. The method of claim 18, further comprising:

receiving a second ESD voltage on the first node, the second ESD voltage being greater than a reference supply voltage of a reference voltage supply, the second ESD voltage corresponding to a second ESD event;

turning on a second diode, thereby conducting a second ESD current from a second anode of the second diode to a second cathode of the second diode;

conducting the second ESD current from the second cathode of the second diode to the second signal tap of the ESD clamp circuit; and discharging the second ESD current of the second ESD event by the ESD clamp circuit.

20. The method of claim 19, wherein discharging the second ESD current of the second ESD event by the ESD clamp circuit comprises:

turning on the ESD clamp circuit in response to the second ESD current being received at the second signal tap of the ESD clamp circuit or the third node;

coupling the third node to the second node in response to the ESD clamp circuit turning on;

conducting the second ESD current from the second signal tap to the first signal tap of the ESD clamp circuit; and conducting the second ESD current from the first signal tap of the ESD clamp circuit to a fifth node.

* * * * *